United States Patent
Berger et al.

(10) Patent No.: US 11,543,461 B2
(45) Date of Patent: Jan. 3, 2023

(54) MULTI-CELL AC IMPEDANCE MEASUREMENT SYSTEM

(71) Applicant: Infineon Technologies AG, Neubiberg (DE)

(72) Inventors: Andreas Berger, Klagenfurt (AT); Klaus Hoermaier, Krumpendorf (AT); Guenter Hofer, St. Oswald (AT); Stefano Marsili, Faak am See (AT); Akshay Misra, Munich (DE); Matthias Rose, Kirchseeon (DE); Christian Winkler, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 351 days.

(21) Appl. No.: 16/744,892

(22) Filed: Jan. 16, 2020

(65) Prior Publication Data
US 2021/0223327 A1    Jul. 22, 2021

(51) Int. Cl.
| G01R 31/396 | (2019.01) |
| H03M 1/12 | (2006.01) |
| G01R 31/3842 | (2019.01) |
| G01R 31/389 | (2019.01) |
| G01R 31/392 | (2019.01) |

(52) U.S. Cl.
CPC ......... G01R 31/396 (2019.01); G01R 31/389 (2019.01); G01R 31/3842 (2019.01); G01R 31/392 (2019.01); H03M 1/12 (2013.01)

(58) Field of Classification Search
CPC ............ G01R 31/396; G01R 31/3842; G01R 31/389; G01R 31/392; G01R 27/02; H03M 1/12; H03M 1/1205
See application file for complete search history.

(56) References Cited

U.S. PATENT DOCUMENTS

| 2017/0131363 | A1* | 5/2017 | Scott | G01R 31/392 |
| 2019/0115762 | A1  | 4/2019 | Marsili et al. | |
| 2022/0120817 | A1* | 4/2022 | Okada | H01M 10/48 |

OTHER PUBLICATIONS

E. Din, C. Schaef, K. Moffat and J. T. Stauth, "Online spectroscopic diagnostics implemented in an efficient battery management system," 2015 IEEE 16th Workshop on Control and Modeling for Power Electronics (COMPEL), 2015, pp. 1-7 (Year: 2015).*
Panasonic, "Panasonic Develops Battery Management Technology to Measure Electrochemical Impedance of multi-cell stacked Lithium-Ion Batteries", Nov. 14, 2019; 4 pages.
Texas Instruments, "bq40z50-R2 1-Series, 2-Series, 3-Series, and 4-Series Li-Ion Battery Management", SLUSCS4-A, bq40z50-R2, Jun. 2017, Revised Oct. 2017, 52 pages.

\* cited by examiner

*Primary Examiner* — Daniel R Miller
(74) *Attorney, Agent, or Firm* — Slater Matsil, LLP

(57) ABSTRACT

A method for measuring a complex impedance of a plurality of battery cells in a battery pack comprises controlling an excitation current through the plurality of battery cells in the battery pack; receiving, in a single common measurement circuit, a plurality of voltage signals corresponding to the plurality of battery cells; measuring the excitation current; and calculating a complex impedance of each of the battery cells in the plurality of battery cells based on the plurality of voltage signals and the measured excitation current in a single measurement cycle using either one analog-to-digital converter (ADC) per battery cell or two matched ADCs per battery cell.

7 Claims, 16 Drawing Sheets

MULTI-CELL AC IMPEDANCE MEASUREMENT SYSTEM

TECHNICAL FIELD

The present invention relates generally to a multi-cell AC impedance measurement system and method.

BACKGROUND

An electric vehicle battery (EVB) is a battery used to power the propulsion system of a battery electric vehicle (BEV). Vehicle batteries are usually a secondary (rechargeable) battery, are typically lithium-ion batteries, and typically comprise a plurality of battery cells in a battery pack. A typical battery pack can comprise numerous battery cells, for example up to 100 batteries in each battery pack. A measurement integrated circuit (IC) and other external components are typically used to measure the DC impedance of each battery cell in the battery pack. Implementation costs to measure each battery cell in the battery pack are therefore significant, and the number of nodes in a corresponding communication chain is also quite high, which also adds to implementation costs.

SUMMARY

In accordance with an embodiment, a method for measuring a complex impedance of a plurality of battery cells in a battery pack includes controlling an excitation current through the plurality of battery cells in the battery pack; receiving, in a single common measurement circuit, a plurality of voltage signals corresponding to the plurality of battery cells; measuring the excitation current; and calculating a complex impedance of each of the battery cells in the plurality of battery cells based on the plurality of voltage signals and the measured excitation current in a single measurement cycle using either one analog-to-digital converter (ADC) per battery cell or two matched ADCs per battery cell.

In accordance with another embodiment, a circuit includes a voltage measurement circuit coupled to a plurality of input voltage pad pairs, the input voltage pad pairs configured for coupling to a corresponding plurality of battery cells coupled in series in a battery pack; a high side pad configured for coupling to a first end of the plurality of battery cells coupled in series in the battery pack; a low side pad configured for coupling to a second end of the plurality of battery cells coupled in series in the battery pack; an excitation current generator coupled between the high side pad and the low side pad for controlling an alternating current flowing through the plurality of battery cells; a current measurement circuit coupled to a current sense element configured for generating a voltage representative of a current through at least one of the plurality of battery cells in the battery pack; at least one matched pair of analog-to-digital converters (ADCs); and a digital processing circuit coupled to the plurality of input voltage pad pairs and the current sense element configured for activating the excitation current generator, receiving a voltage measurement signal from the voltage measurement circuit, measuring the received voltage measurement signal with one ADC of a matched pair, receiving a current measurement signal from the current measurement circuit, measuring the received current measurement signal with the other ADC of the said matched pair, and calculating a complex impedance of each of the plurality of battery cells in the battery pack in a single measurement cycle from the received voltage measurement signal and the received current measurement signal.

In accordance with another embodiment, a battery measurement system includes an excitation current source configured to be coupled across a plurality of battery cells; a current sense element coupled to the excitation current source; a plurality of separate data converter circuits, wherein each separate data converter circuit of the plurality of separate data converter circuits includes a current sense input coupled to the current sense element and a pair of voltage sense inputs configured to be coupled across a corresponding battery cell of the plurality of battery cells, and each separate data converter circuit is configured to provide current measurement data based on a signal at the current sense input and voltage measurement data based on a signal at the pair of voltage sense inputs; and a digital processing circuit coupled to the plurality of separate data converter circuits, the digital processing circuit configured to calculate a complex impedance for each battery cell of the plurality of battery cells based on the current measurement data and the voltage measurement data provided by the separate data converter associated with the corresponding battery cell.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
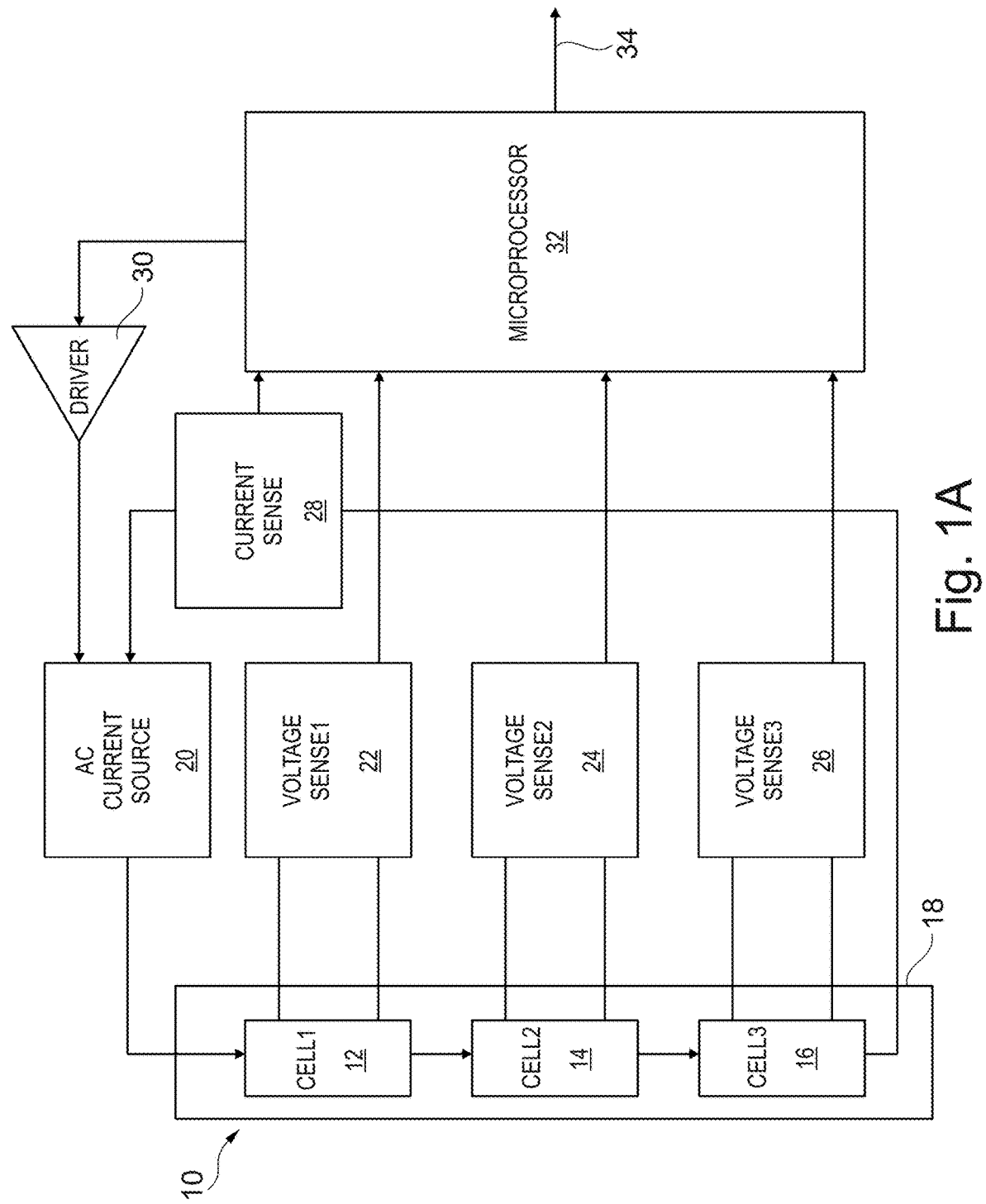
FIG. 1A is a block diagram of a multi-cell AC impedance measurement system for measuring the AC impedance of an example of three battery cells in a battery pack.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, a system and method for measuring an AC impedance in a multi-cell battery system. Embodiments of the present invention, however, can be applied to other types of circuits and systems that utilize impedance measurements.

According to an embodiment, an AC impedance measurement system measures an impedance of each of a plurality of battery cells coupled in series by applying an AC current to the plurality battery cells and measuring the voltage across each battery while the AC current is applied. In some embodiments, these measurements are made during a single measurement cycle. In some embodiments, the AC or complex impedance of each of the plurality is measured. In an embodiment, an individual battery cell may comprise a physical battery cell. In other embodiments, an individual battery cell may comprise a logical cell comprising a series or parallel combination of physical battery cells, or other configurations and combinations of physical battery cells.

In some embodiments, the plurality of battery cells whose complex impedance is being measured is a subset of the entirety of the battery cells in the battery pack. For example, while the entire battery pack may include one hundred battery cells, there is an advantage in having one measurement integrated circuit (also referred to herein as a "chip") configured for measuring the complex impedance of between two and eighteen battery cells, and preferably two to six battery cells. In these embodiments, wiring lengths between the battery cells and the measurement chip can be kept relatively short, which improves measurement accuracy.

In some embodiments, a pair of matched ADCs are used to measure the AC voltage and AC current associated with a single battery cell. For example, a first ADC will be used to convert a voltage representative of a current flowing through a battery cell into a digital output signal, and a second ADC matched to the first ADC will be used convert a voltage across the battery cell into a digital output signal. For maximum accuracy in the measurement results, it is desirable that these ADCs match to minimize gain and offset errors. Methods for manufacturing a pair of matched ADCs are well known by those skilled in the art. For example, the matched ADCs have the same or mirrored layouts and are located close together or are adjacent on an integrated circuit. Temperature gradients across the integrated circuit are typically controlled so that each ADC experiences the same or a similar temperature gradient. Care is taken to ensure that each ADC experiences similar manufacturing conditions during each of the manufacturing steps, such as controlling doping gradients. Other layout and manufacturing techniques are known in the art for matching circuits such as analog-to-digital converters. In other embodiments, the matching requirements are minimized by using a time-multiplexed single ADC to convert both current and voltage signals to a corresponding digital signal.

Advantages of embodiments include the ability to efficiently implement Electrochemical Impedance Spectroscopy (EIS) for battery packs. These efficiencies may include, but are not limited to, faster measurement time, and the ability to implement the measurement circuitry using a smaller Bill of Materials (BOM) and/or less silicon area than some conventional battery cell measurement circuits and systems. In addition, the AC impedance of cell connectors between battery cells can also be efficiently measured.

In various embodiments directed to battery management applications, the complex AC impedance information can be used for estimating several internal parameters of a battery cell such as battery cell internal temperature, State of Health (SoH) of the battery cell, and State of Charge (SoC) of the battery cell, among other parameters.

There is a fundamental difference between the measurement procedure and the information that is contained in a DC impedance (real number) and an AC impedance (complex number) of a battery cell. The AC impedance is a complex number (real part+j imaginary part) whereas the DC impedance is only a real number. Thus, the AC impedance can be referred to herein as the AC impedance or the complex impedance. To estimate key cell parameters at different frequencies, as per application, an AC impedance is used. The low frequency impedance contains information on the cell-internal chemical processes and can be used for SOC and SOH estimation. This information is partly also inside the DC impedance. The higher frequencies are less sensitive to SOC/SOH changes and can be used to estimate the inner cell temperature. Furthermore, the real and the imaginary part of the complex AC impedance can be used to distinguish between battery internal processes. For example, some battery processes affect the imaginary part of the battery impedance, other battery processes affect the real part of the battery impedance, and yet other processes affect both the read and imaginary part of the battery impedance. Additionally, the change in AC impedance with frequency may be used for characterizing battery cell parameters. For example, the internal temperature of the battery can be estimated by performing an AC impedance measurement within a certain frequency range. This frequency range over which this estimation is the most accurate may vary with respect to battery type and/or battery manufacture.

To measure the AC impedance of a whole battery pack, the impedance of every single battery cell may be monitored. An embodiment multi-cell AC impedance measurement system described herein thus provides an efficient solution to measure the AC impedance of multiple, stacked, battery cells as well as corresponding cell connectors using a single multi-cell AC impedance IC, thus reducing overall system costs.

FIG. 1A is a block diagram of a multi-cell AC impedance measurement system 10 for measuring the AC impedance of an example of three battery cells 12, 14, and 16 in a battery pack 18 at a given frequency. Measurement system 10 includes an AC current source 20 that may comprise a transistor and additional components such as resistors, in an embodiment. The AC current source 20 provides an AC excitation current at the given frequency to a subset of the battery cells in battery pack 18, for example battery cells 12, 14, and 16, which are coupled in series. The AC excitation current flows into battery cell 12, through battery cell 14, and out of battery cell 16, in an embodiment. The current flowing out of battery cell 16 is returned to AC current source 20 through current sensing circuit 28. In an embodiment, current sensing circuit 28 may comprise a resistor. Measurement system 10 may include a driver circuit 30 for receiving a digital input value representative of, for example, a sine wave, from microprocessor 32 and for providing an appropriate driving signal to AC current source 20. Multi-cell AC impedance measurement system 10 also includes a plurality of voltage sense circuits 22, 24, and 26 coupled to corresponding battery cells 12, 14, and 16. The voltage across each of the battery cells 12, 14, and 16 is sensed by a voltage sensing element, such as an analog-to-digital converter (ADC) in an embodiment. Microprocessor 32 receives a signal from the current sensing circuit 28 representative of the AC excitation current flowing through the battery cells 12, 14, and 16. Microprocessor 32 also receives signals from voltage current sensing circuits 22, 24, and 26 representative of the AC voltage response from each of the battery cells 12, 14, and 16. Microprocessor 32 includes digital signal processing circuitry for calculating the AC impedance of each of the battery cells 12, 14, and 16 by dividing the received AC voltage signals by the received AC current signal. The AC impedances are provided at output node 34 of microprocessor 32 as a digital output value including a real portion and an imaginary portion representative of the AC impedance at the excitation frequency.

Figure 1B:
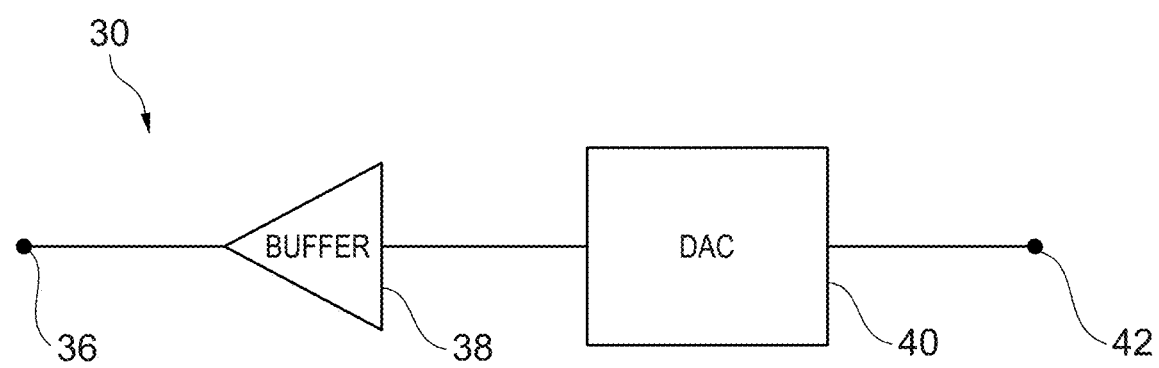
FIG. 1B is a block diagram of a driver circuit shown in FIG. 1A.

FIG. 1B is a block diagram of the driver circuit 30 shown in FIG. 1A. In an embodiment, driver circuit 30 can be a gate driver circuit for driving a transistor gate inside of AC current source 20. In an embodiment, driver circuit 30 comprises a digital-to-analog converter (DAC) 40 for receiving the digital input value from microprocessor 32 at input node 42 and generating a corresponding analog voltage such as a sine wave at a given frequency. The output of DAC 40 is coupled to the input of a buffer amplifier 38 for driving, for example, the gate of a transistor inside of AC current source 20 at output node 36.

Multi-cell AC impedance measurement system 10 may include one or more additional components such as those shown in FIG. 1A for measuring additional battery cells in battery pack 18. Measurement system 10 may also be used to make a series of AC impedance measurements at various frequencies so that the impedance and characteristics of the measured battery cells can be determined over a frequency spectrum using Electrochemical Impedance Spectroscopy (EIS) as noted above. While a single AC current source 20 is shown in FIG. 1A, individual AC current sources for each battery cell 12, 14, and 16 can also be used in embodiments. While AC current source 20 may comprise a single transistor and associated resistive components, any known current source circuit may be used. Representative embodiments of the multi-cell AC impedance measurement system 10 shown in FIG. 1A are shown in additional drawing figures and described in further detail below.

Figure 2A:
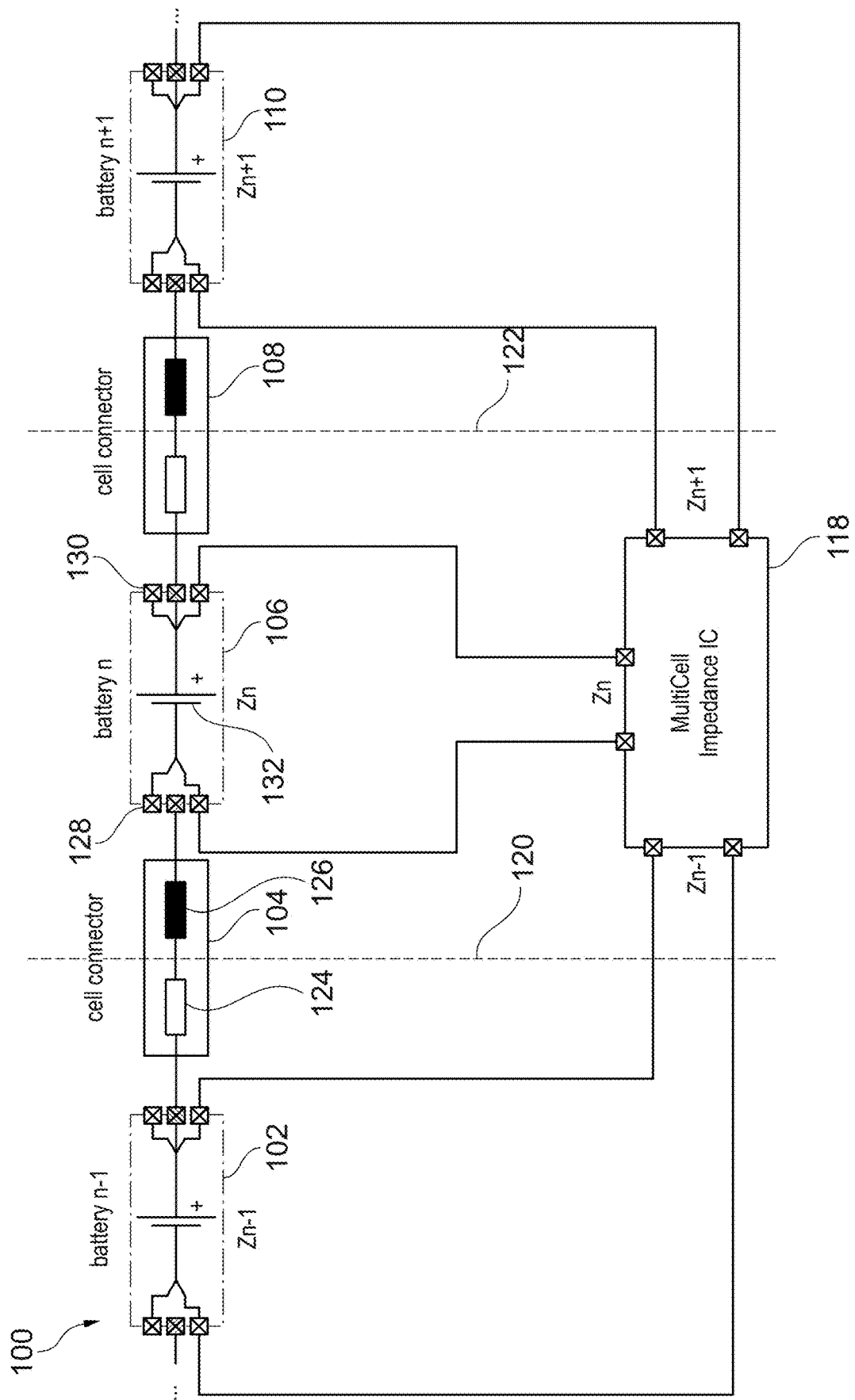
FIG. 2A is a schematic diagram of a multi-cell AC impedance measurement system for measuring the AC impedance of an example of three battery cells in a battery pack.

FIG. 2A is a schematic diagram of a multi-cell AC impedance measurement system 100 for measuring the AC impedance of an example of three battery cells in a battery pack. A battery pack includes a plurality of battery cells, wherein three battery cells 102, 106 and 110 are shown. Also shown are cell connectors 104 and 108. Each battery typically includes a first plurality of terminals 128 for making a first Kelvin connection, an internal battery cell 132, and a plurality of terminals 130 for making a second Kelvin connection. Note that at least one of the Kelvin connection terminals at each end of batteries 102, 106, and 110 is not shared with another battery cell. The provision of Kelvin terminals at every battery cell end ensures that connector impedance between battery cells can be properly measured. Measuring connector impedance is described in further detail below, with respect to FIG. 2B. Each cell connector 104, 108 includes a resistive portion 124 and an inductive portion 126. The single integrated circuit or PCB 118 is used to simultaneously monitor the impedances (Zn, Zn−1 and Zn+1) of multiple battery cells through a corresponding plurality of pad pairs. The reduced number of PCBs or ICs and external components significantly reduces the costs of the overall system compared to a single cell approach. The more batteries that are monitored with one multi-cell IC 118, the higher the potential cost reduction.

FIG. 2A thus illustrates an example AC impedance measurement IC system 100 for concurrently measuring the impedance of three battery cells 102, 106, and 110 having a multi-cell impedance IC 118 in a single measurement cycle, which can comprise one or more measurement periods, $T_{meas}$. The AC impedance measurement system and multi-cell impedance IC and method of operation is described in further detail below.

Figure 2B:
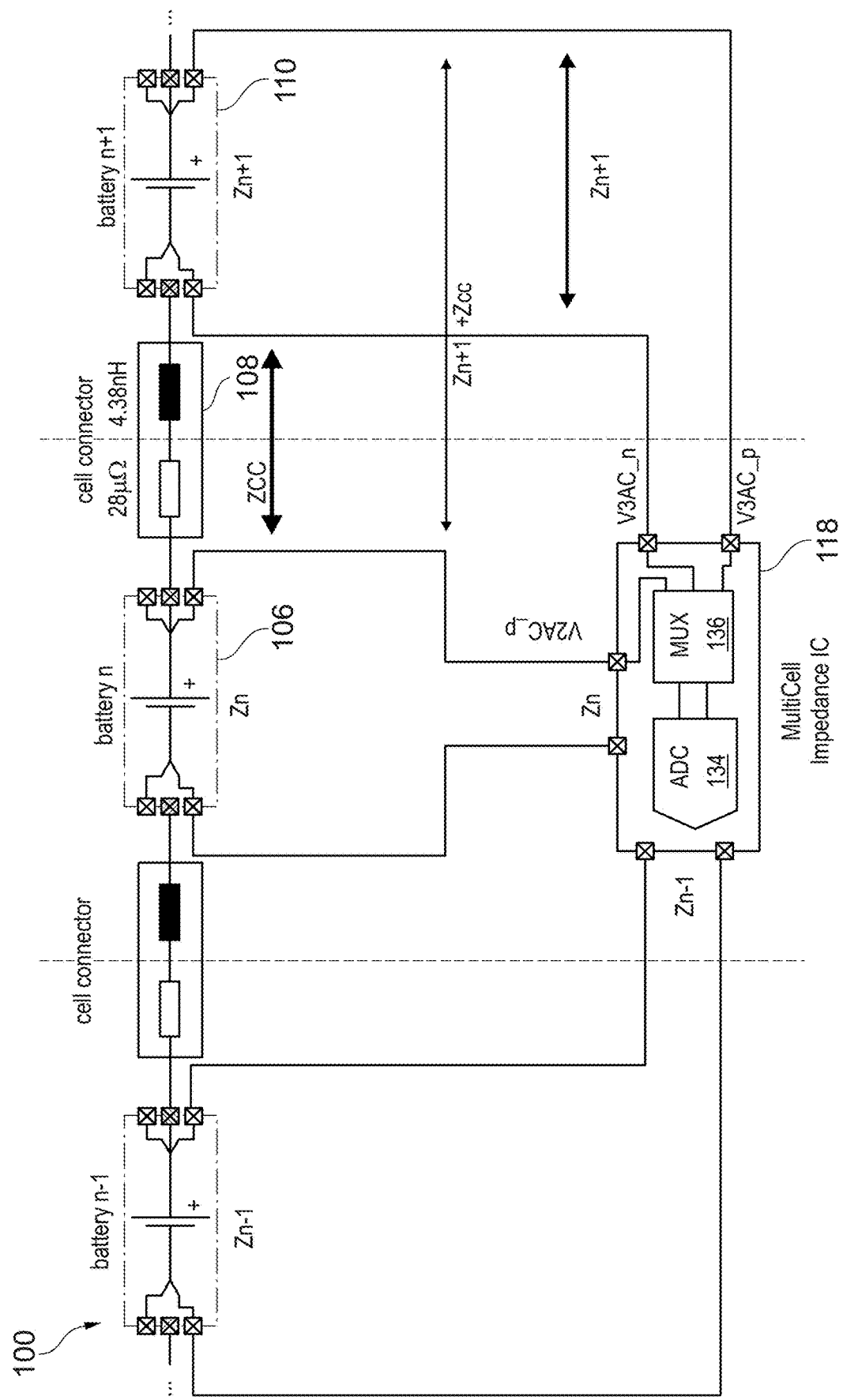
FIG. 2B is a schematic diagram of a multi-cell AC impedance measurement system configured to monitor the AC impedance of a cell connector between two of the three battery cells shown in FIG. 1.

FIG. 2B is a schematic diagram of a multi-cell AC impedance measurement system configured to monitor the AC impedance of a cell connector between two of the three battery cells shown in FIG. 2A. FIG. 2B is substantially the same schematic as was shown in FIG. 2A, except that an AC impedance of cell connector 108 is labeled Zcc and is shown to be 28 µΩ and 4.38 nH for a typical application. The impedance values of cell connector 108 can vary depending upon the process and the materials used for the cell connector, and are typically in the µΩ and nH range. The AC impedance of cell connector 108 and battery cell no is labeled Zn+1+Zcc, and the AC impedance of battery cell no is labeled Zn+1. Additionally, multi-cell impedance IC 118 is shown to include a multiplexer (MUX) 136 having an input coupled to pad V2AC_p coupled to the second Kelvin connector of battery cell 106, having an input coupled to pad V3AC_n coupled to the first Kelvin connector of battery cell no, and having an input coupled to pad V3AC_p coupled to the second Kelvin connector of battery cell no. Multi-cell impedance IC 118 also includes an analog-to-digital converter (ADC) 134 coupled to MUX 136.

Thus, another advantage of the multi-cell AC impedance method described herein according to embodiments is that it offers the possibility to monitor the impedance of the cell connector 108, which has a nominal impedance of 28 µΩ and 4.38 nH. Cell connector impedance monitoring may be implemented as a diagnostic function. It is used to check if the connection between the corresponding cells 106 and no in an embodiment has been significantly degraded due to for example, corrosion or welding spots coming loose. FIG. 2B shows an embodiment arrangement for monitoring the cell connector impedance Zcc with a multi-cell impedance integrated circuit 118.

To measure the cell connector impedance Zcc between battery cell 106 (battery n) and battery cell no (battery n+1), two different measurement methods can be used: a delta measurement method and a direct cell connector measurement method.

For the delta measurement, the impedance Zn+1 is measured in a first step, then the V3AC_n signal is exchanged with the V2AC_p signal via the internal MUX 136 and the impedance Zn+1+Zcc is measured in a second step, and the difference between the two measurements is calculated to obtain the impedance of the connector Zcc=Zn+1+Zcc−Zn+1 in a third step. The delta measurement method has the advantage that the expected impedances are always in a value range where the impedance measurement system has acceptable performance, but two measurements are required.

For the direct cell connector measurement, the internal mux 136 is used to directly connect the V3AC_n signal and the V2AC_p signal directly to ADC 134 to directly measure the impedance Zcc. The direct cell connector measurement method only needs one measurement, but as the expected values are very small, the measurement results may be less accurate.

The multiplexer 136 is coupled to a digital processing circuit (not shown in FIG. 2B) to calculate a first complex impedance of a first battery cell no of the plurality of battery cells and to calculate a second complex impedance including the first complex impedance of the first battery cell no plus a series complex impedance of a cell connector 108 associated with the first battery cell no. The complex impedance of the cell connector 108 is calculated by the digital processing circuit by subtracting the first complex impedance from the first complex impedance, in an embodiment.

Figure 3:
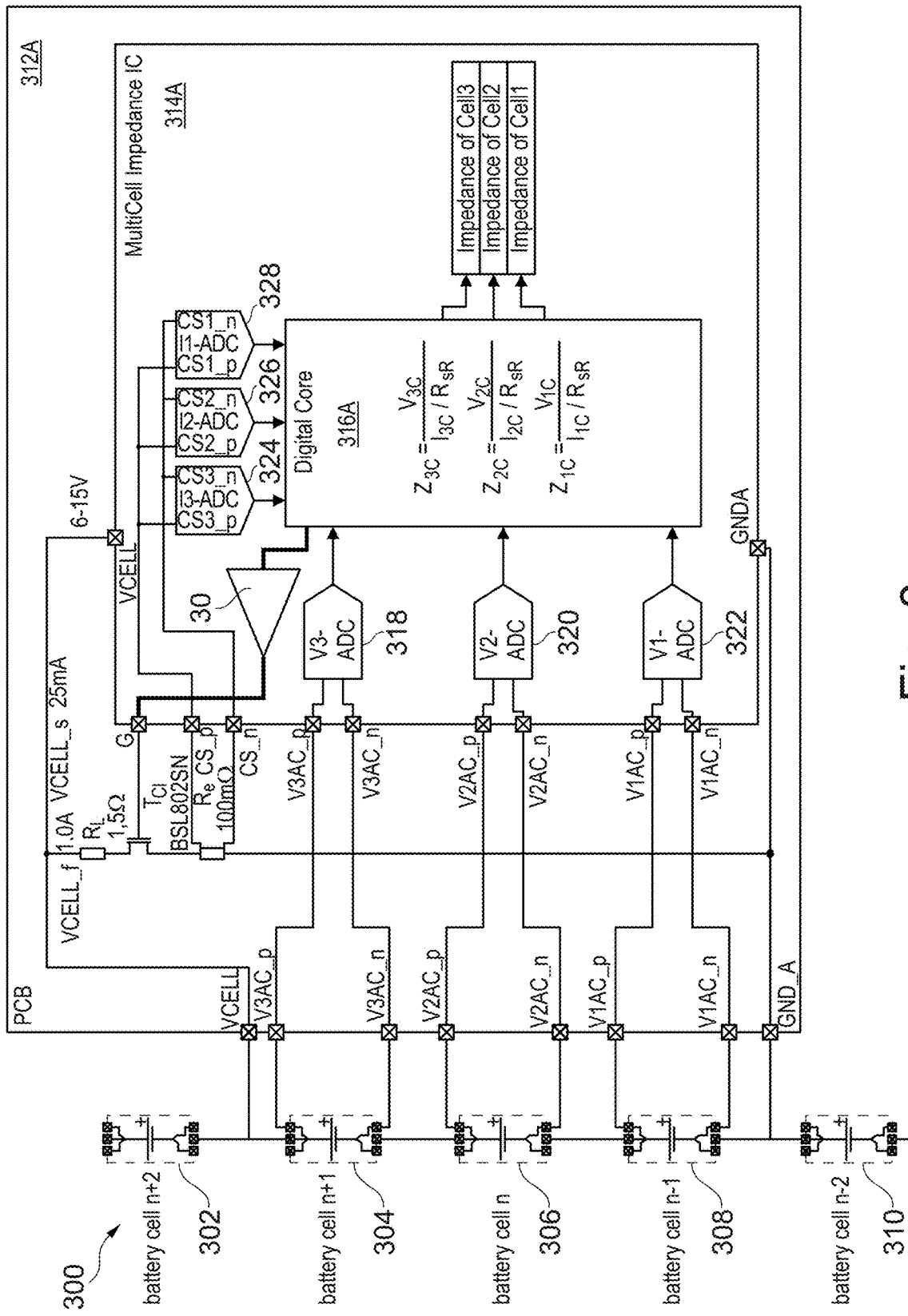
FIG. 3 is a schematic diagram of a parallel implementation of a multi-cell AC impedance measurement system.
Figure 5:
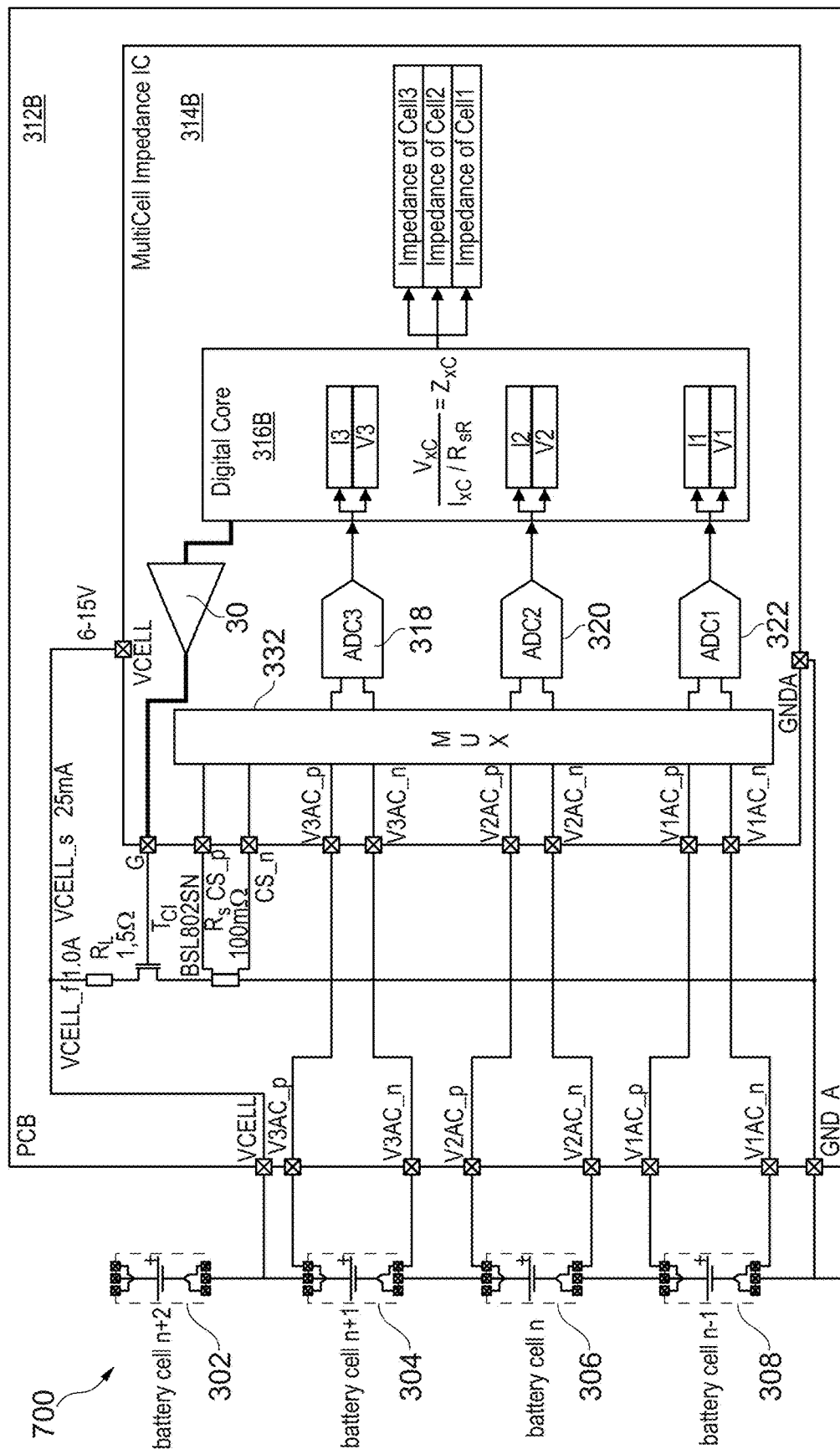
FIG. 5 is a schematic diagram of a sequential implementation of an AC impedance measurement system having a multiplexer (MUX) and one ADC per battery cell.
Figure 7:
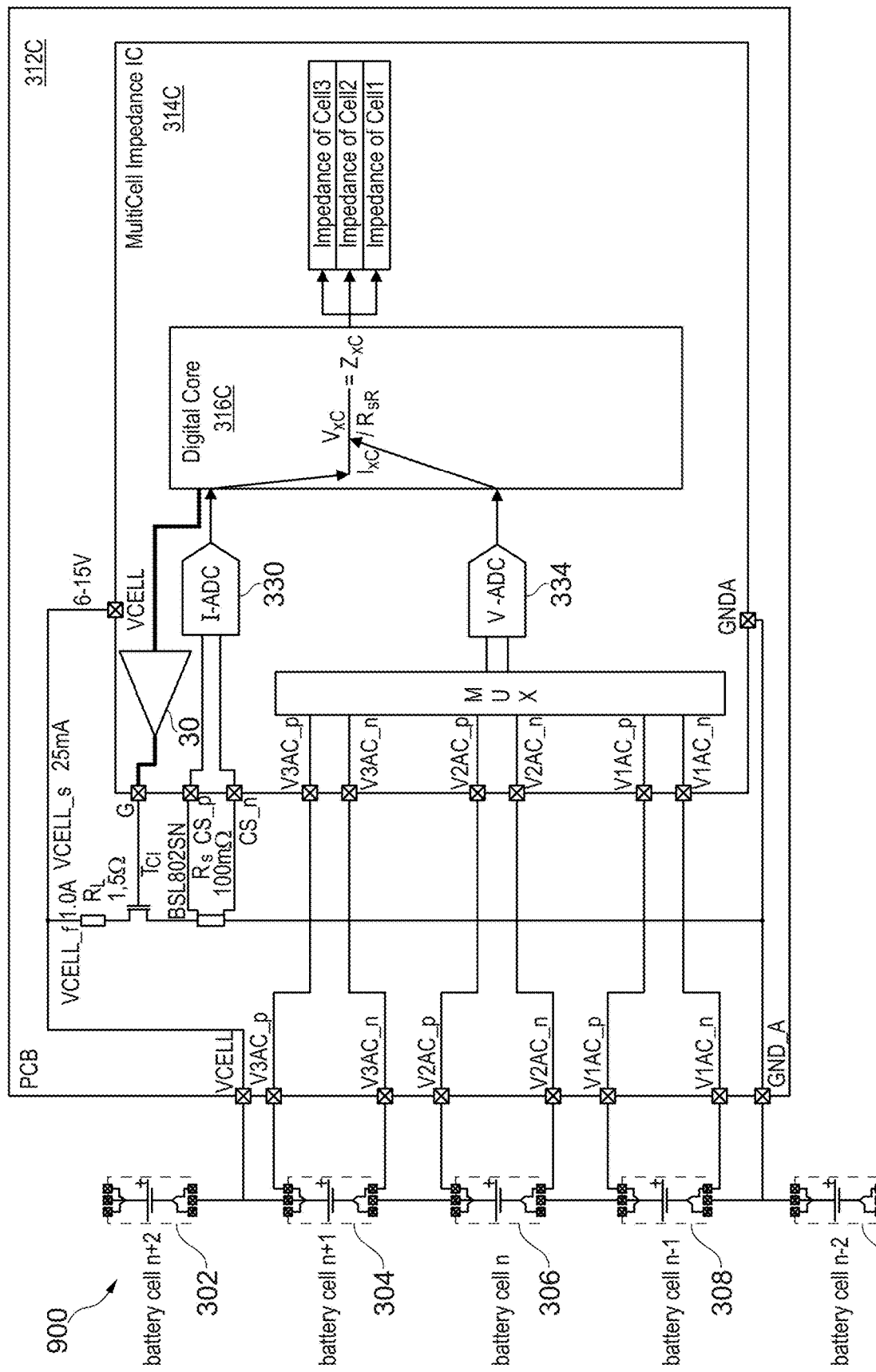
FIG. 7 is a schematic diagram of an implementation of a multi-cell AC impedance measurement system having a single pair of ADCs and a MUX.

The multi-cell impedance integrated circuit 118 shown in FIG. 2B including multiplexer 136 and ADC 134 for providing the connector impedance measurement function can be merged into multi-cell integrated circuits 314A shown in FIG. 3, 314B shown in FIG. 5, 314C shown in FIG. 7, and 314D shown in FIG. 9, which are described in further detail below. The output of ADC 134 is coupled to the corresponding digital processing circuits 316A, 316B, 316C, and 316D.

FIG. 3 is a schematic diagram of a fully parallel implementation of a multi-cell AC impedance measurement system 300, and is a specific embodiment of the multi-cell AC impedance measurement system 10 shown and described above with respect to FIG. 1A. Measurement system 300 illustrates a plurality battery cells 302, 304, 306, 308, and 310 in a battery pack, a multi-cell impedance IC 314A resident on a PCB 312A, including other measurement components described in further detail below. In some embodiments, multi-cell impedance IC 314A is disposed on a single semiconductor substrate, such as a silicon substrate. Alternatively, multi-cell impedance ICs 314A may be partitioned across a plurality of separate semiconductor substrates. Multi-cell impedance ICs 314B, 314C, 314D and 314E described below may be similarly partitioned.

The remaining battery cells in the battery pack are not shown in FIG. 3. While five battery cells of the battery pack are shown, only three of the battery cells 304, 306, and 308 are measured by the multi-cell impedance IC 314A. While three battery cells are measured in FIG. 3, any number of battery cells can be measured in a single measurement cycle. For example, two to eighteen battery cells can be measured in a single measurement cycle using a single multi-cell impedance IC 314A. In an embodiment wherein five battery cells are measured using a single multi-cell impedance IC, a total of twenty multi-cell impedance ICs would be used to monitor a battery pack with one hundred battery cells in series. Alternatively, multiplexing circuitry for sequentially coupling one or more multi-cell impedance ICs to five battery cells at a time could also be used.

Multi-cell impedance IC 314A comprises a plurality of input voltage pad pairs V1AC_n and V1AC_p, V2AC_n and V2AC_p, and V3AC_n and V3AC_p configured for coupling to a corresponding plurality of battery cells 308, 306, and 304 in a battery pack; an output voltage pad (high side pad) VCELL configured for coupling to one of the plurality of battery cells 304 in the battery pack; a ground pad (low side pad) GNDA configured for coupling to at least another of the plurality of battery cells 308 in the battery pack; a current sense pad pair (current sense element) CS_p and CS_n configured for receiving a voltage representative of a current through at least one of the plurality of battery cells 304, 306, and 308 in the battery pack; and a digital processing circuit 316A coupled to the plurality of input voltage pad pairs V1AC_p and V1AC_n, V2AC_p and V2AC_n, and V3AC_p and V3AC_n and the current sense pad pair CS_p and CS_n configured for calculating a complex impedance of each of the plurality of battery cells in the battery back in a single measurement cycle. In an embodiment, the voltage for powering multi-cell impedance IC 314A and subsequent multi-cell impedance ICs can be provided by battery cells 304, 306, and 308.

The PCB 312A further comprises a transistor $T_{CL}$ coupled between the output voltage pad VCELL and the ground pad GNDA for forcing a single current through the plurality of battery cells 304, 306, and 308 in the battery pack. Transistor $T_{CL}$ and resistor $R_L$ implement an example of AC current source 20 (also referred to herein as an excitation current generator, which, in an embodiment, can also include gate driver 30), and series resistor implements an example of current sense circuit 28. In an embodiment, a load resistor $R_L$ having a typical resistance of about 1.5Ω is coupled between the drain of transistor $T_{CL}$ and the VCELL pad of the multi-cell impedance IC 314A and the VCELL pad of PCB 312A. Load resistor $R_L$ can be any resistance suited to a particular application having a value above or below 1.5Ω as desired. A current sense resistor $R_S$ having a typical resistance of about 100 mΩ (although any appropriate value of resistance can be used in a particular application) is coupled between the source of transistor $T_{CL}$ and the GNDA pad of the multi-cell impedance IC 314A and the GND_A pad of the PCB 312A. Current sense resistor $R_S$ is also coupled to the current sense pad pair CS_p and CS_n. In an embodiment, sense resistor $R_S$ can alternatively be placed at the high side between VCELL and the drain of transistor $T_{CL}$ or even in series with the main battery pack current if desired. The gate of transistor $T_{CL}$ is coupled to the gate driver G pad of multi-cell impedance IC 314A. The gate driver 30 is shown in FIG. 3, and in subsequent figures, coupled between the digital processing circuit 316A and the gate driver G pad. In an embodiment, the load resistor $R_L$, the transistor $T_{CL}$, and the current sense resistor $R_S$ can all be fabricated inside of the multi-cell impedance IC 314A. While a one-to-one correspondence is shown between transistor $T_{CL}$ and the multi-cell impedance IC 314A, transistor $T_{CL}$, as well as load resistor $R_L$ and series resistor $R_S$ can be multiplexed between pluralities of multi-cell ICs for sequentially driving groups of battery cells in the battery pack.

The PCB 312A thus has a mirror pinout including a pad corresponding to the pads described above with respect to multi-cell impedance IC 314A, except for the current sense pad pair CS_p and CS_n, and the gate driver G pad. In some embodiments, one set of pads may be used if transistor $T_{CL}$, and resistors $R_L$ and $R_S$ are integrated into the multi-cell impedance IC 314A.

In the embodiment shown in FIG. 3, the multi-cell impedance IC 314A comprises a first plurality of analog-to-digital converters 322, 320, and 318 coupled between the a plurality of input voltage pad pairs V1AC_p and V1AC_n, V2AC_p and V2AC_n, and V3AC_p and V3AC_n and the digital processing circuit 316A; and a second plurality of analog converters 324, 326, and 328 coupled between the current sense pad pair CS_p and CS_n and the digital processing circuit. Any suitable architecture can be used for ADCs 318, 320, 322, 324, 326, and 328 such as a sigma-delta ADC. Any suitable sampling rate can be used as long as the sampling rate is greater than or equal to the Nyquist rate of the highest frequency AC excitation current used.

FIG. 3 thus shows the implementation of a multi-cell impedance measurement system using the example of a three battery cell solution, where battery cell n+1 304, battery cell n 306 and battery cell n−1 308 are monitored by one multi-cell measurement IC 314A.

Figure 4:
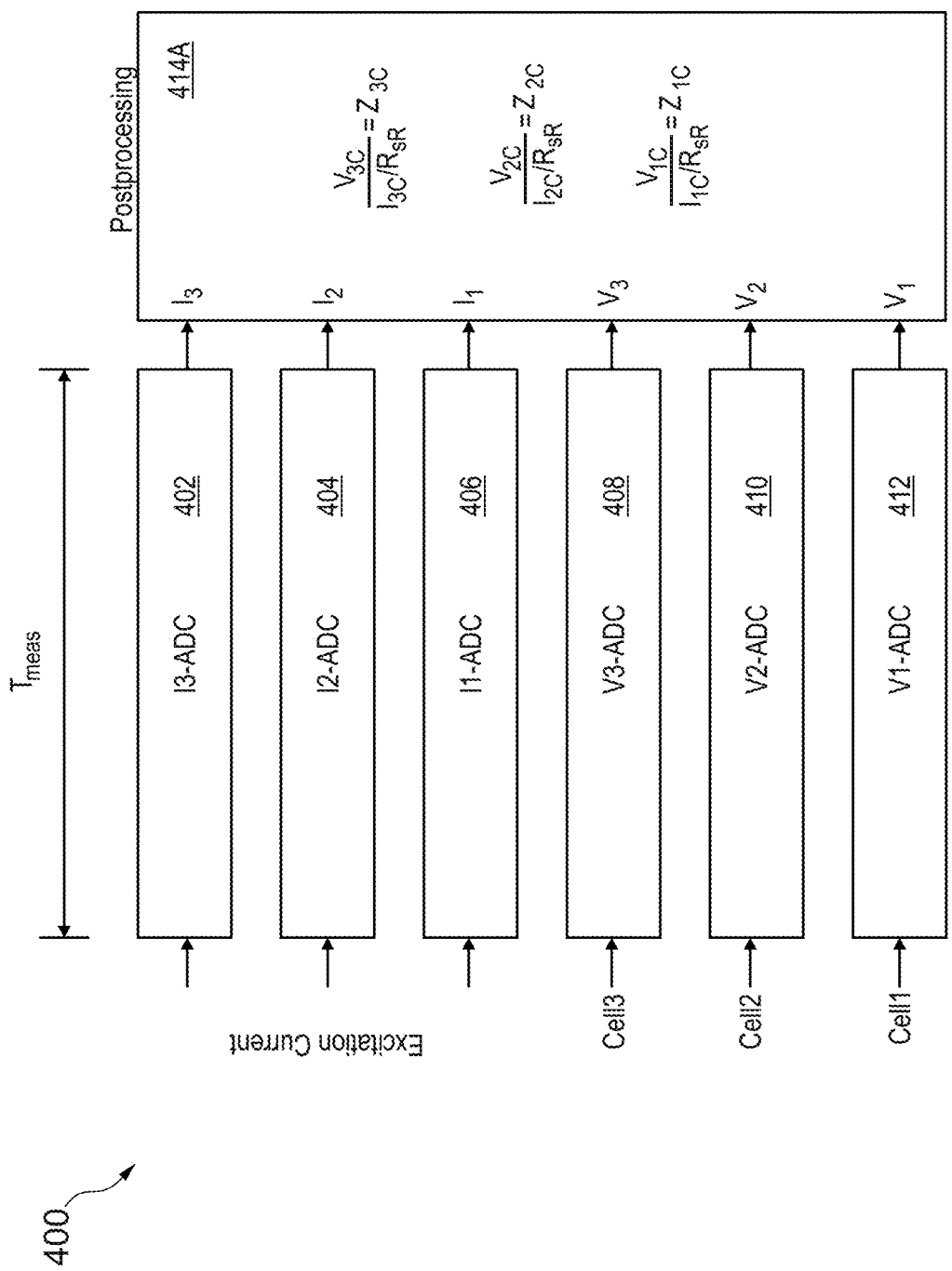
FIG. 4 is a timing diagram of a measurement sequence for the parallel implementation of FIG. 3.

FIG. 4 shows the corresponding measurement sequence 400 for the measurement system 300 shown in FIG. 3. While three battery cells are shown to be measured in FIG. 4, it will be understood by those skilled in the art that any number of battery cells can be measured in a single measurement cycle. FIG. 4 shows three measured excitation currents 402, 404, and 406, as well as three measured battery cell voltages 408, 410, and 412. Postprocessing 414A in digital core 316A calculates three complex impedance values $Z_{1C}$, $Z_{2C}$ and $Z_{3C}$. The calculation of each individual complex impedance follows the following formula:

$$Z_{xC} = \frac{V_{xC}}{I_{xC}/R_{SR}}$$

where $Z_{xC}$, $V_{xC}$ and $I_{xC}$ are complex numbers, x is the index of the cell to be measured, and RR is the real valued gain caused by the current to voltage conversion of the sense resistor. The conversion of the ADC value to a complex V/I value is done via digital filtering/calculations described in further detail with respect to FIGS. 11-13. Any gain and phase mismatch between the pair of voltage ADC values and current ADC values (e.g. V1-ADC 412 and I1-ADC 406) caused by mismatches between the ADCs and the associated signal paths may cause an error in the calculated impedance. Thus good matching will improve accuracy of the calculated impedance. In some embodiments, circuit matching techniques known in the art may be used to match the gain and phase of the various signal paths in order to improve the accuracy of the calculated impedance. In one embodiment associated with multi-cell AC impedance measurement system 300 shown in FIG. 3, ADCs associated with a particular battery cell are matched together in order to reduce variations in the ratio of measured voltage to measured current. For example, V1-ADC 322 and I1-ADC 328 associated with battery cell 308 are matched together; V2-ADC 320 and I2-ADC 326 associated with battery cell 306 are matched together; and V3-ADC 318 and I2-ADC 324 associated with battery cell 304 are matched. Each pair of ADCs (which may be collectively referred to as a "separate data conversion circuit" may be matched by locating each ADC of the pair of ADCs adjacent to each other on Multi Cell Impedance IC 314A, by using an identical layout for each ADC, by interdigitating circuit components of the pair of ADCs, and/or by equalizing signal paths associated with each ADC in the pair of ADCs.

Note that in FIG. 4, a single measurement cycle is accomplished in a single measurement period $T_{meas}$, wherein all of the voltage and current measurement are conducted concurrently.

The measurement implementation shown in FIGS. 3 and 4 uses a common excitation current of all measured battery cells and individual sense wires for every battery cell. This approach has an advantage over an individual excitation of each cell in that it reduces the number of external components required, i.e. only one transistor, sense resistor and load resistor is required per each multi-cell impedance IC. In some embodiments, a multiplexer (not shown) may be coupled between the Kelvin connections of batteries 304, 306 and 308 and the input of ADCs 318, 320 and 322 in accordance with the embodiment of FIG. 2 in order to facilitate measuring the complex impedance of cell connectors coupled between each battery cell 304, 306 and 308.

Additional embodiments of the multi-cell AC impedance measurement system 10 shown and described above with respect to FIG. 1A are described below with respect to FIG. 5 through FIG. 10.

FIG. 5 is a schematic diagram of a parallel/sequential implementation of an AC impedance measurement system 700 having a multiplexer (MUX) and one ADC per battery cell. As shown, each ADC 318, 320 and 322 (each of which may be referred to as a "separate data conversion circuit") is associated with a corresponding battery cell 304, 306 and 308. Multi-cell impedance IC 314B includes a multiplexer 332 coupled to the plurality of input voltage pad pairs V1AC_p and V1AC_n, V2AC_p and V2AC_n, and V3AC_p and V3AC_n and the current sense pad pair CS_p and CS_n, and a plurality of analog-to-digital converters 318, 320, and 322 coupled between the multiplexer 332 and the digital processing circuit 316B. PCB 312B and the battery cells 302, 304, 306, 308, and 310 are substantially as previously shown in, for example, FIG. 3. Digital processing circuit 316B is labeled to show separate current and voltage components (I1/V1, I2/V2, and I3/V3) since the impedance of each battery cell is now calculated sequentially.

Figure 6:
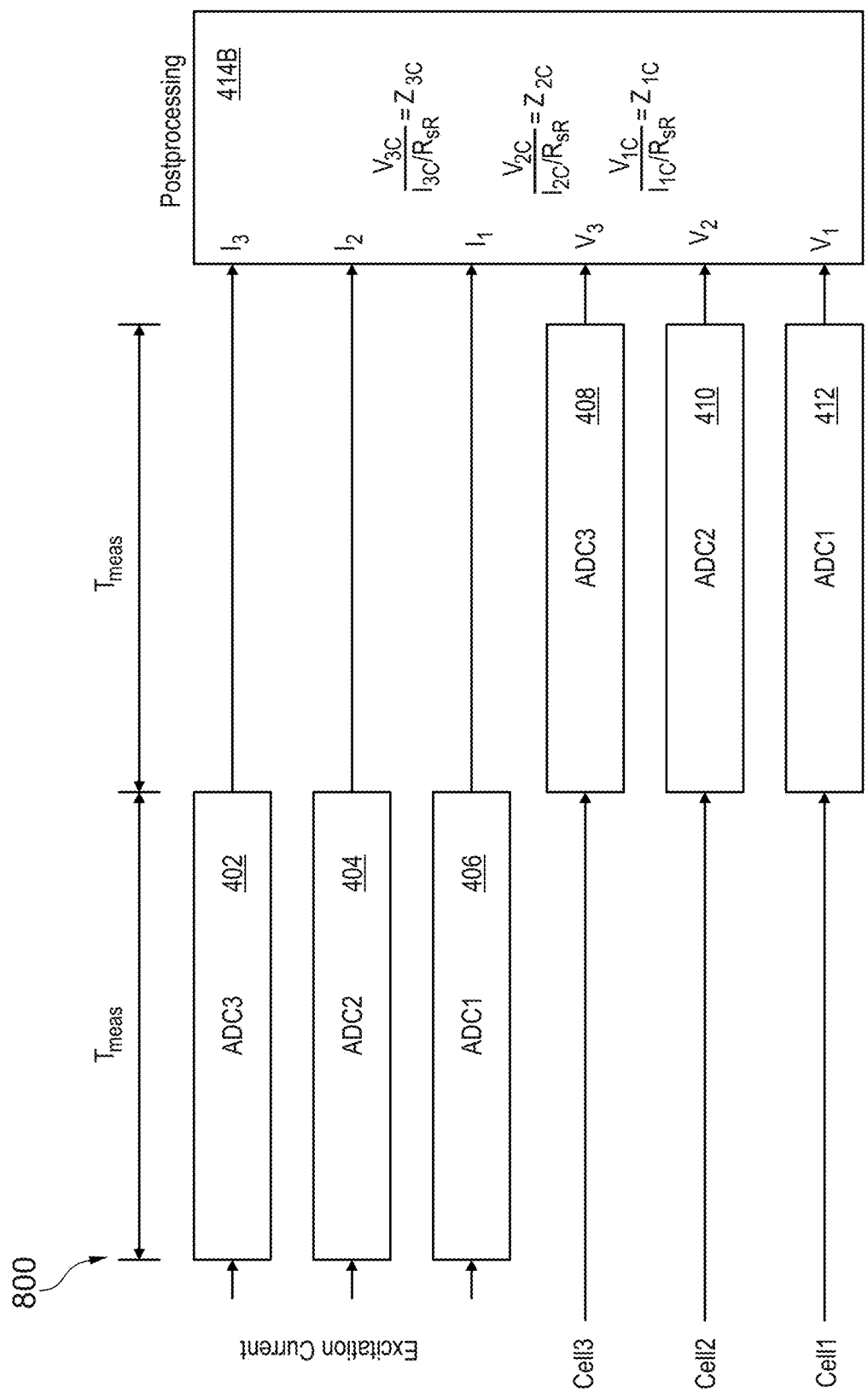
FIG. 6 is a timing diagram of an example measurement sequence of the sequential implementation of FIG. 5.

The implementation variant shown in FIG. 5 uses one ADC per battery cell measured, a MUX 332 and a sequential, two step approach of measuring the impedance of all cells. The measurement cycle 800 for calculating the complex impedances of each battery cell is shown as an example in FIG. 6. FIG. 6 shows three excitation currents 402, 404, and 406 being measured in a first measurement time period $T_{meas}$, and three battery cell voltages 408, 410, and 412 being measured in a second measurement time period $T_{meas}$, although other measurement permutations are possible (for example, one current and two voltages can be measured in a first step, and one voltage and two currents can be measured in a second step.) First, all ADCs measure the current and the resulting values are stored. Then, each ADC measures the battery cell voltage and the impedance is calculated out of the voltage to current ratio. Two measurement periods are required for a single measurement cycle. Postprocessing 414B provided by digital processing circuit 316B sequentially calculates the complex impedances of each battery cell $Z_{1C}$, $Z_{2C}$, and $Z_{3C}$. The measurement cycle 800 shown in FIG. 6 reduces the number of required ADCs to one per cell to be measured, but the required measurement time for all cells is doubled compared to a fully parallel implementation. However, an advantage of the measurement method shown in FIG. 6 is that the matching issue between the ADCs is reduced. In some embodiments, MUX 332 may be used to route the Kelvin connection to battery cells 304, 306 and 308 in accordance with the embodiment of FIG. 2 in order to facilitate measuring the complex impedance of cell connectors coupled between each battery cell 304, 306 and 308.

FIG. 7 is a schematic diagram of an implementation of a multi-cell AC impedance measurement system 900 having a single pair of ADCs 330 and 334, and a MUX 332. Multi-cell impedance IC 314C comprises multiplexer 332 coupled to the plurality of input voltage pad pairs V1AC_p and V1AC_n, V2AC_p and V2AC_n, and V3AC_p and V3AC_n; a first analog-to-digital converter 334 coupled between the multiplexer 332 and the digital processing circuit 316C; and a second analog-to-digital converter 330 coupled between the current sense pad pair CS_p and CS_n and the digital processing circuit 316C. The multi-cell impedance IC 314C and the PCB 316C includes the same pinout as previously described, and the PCB 316C includes external transistor $T_{CL}$ and external resistors $R_L$ and $R_S$, previously described. Representative battery cells 302, 304, 306, 308, and 310 are part of a battery pack also previously described. Measurement system 900 thus uses a common excitation current provided by transistor $T_{CL}$ and only uses one pair of ADCs 330 and 334 with a multiplexer 332 in front switching between the different battery cells 304, 306, and 308 to be measured as shown in FIG. 7. The corresponding measurement sequence 1000 is illustrated in FIG. 8.

Figure 8:
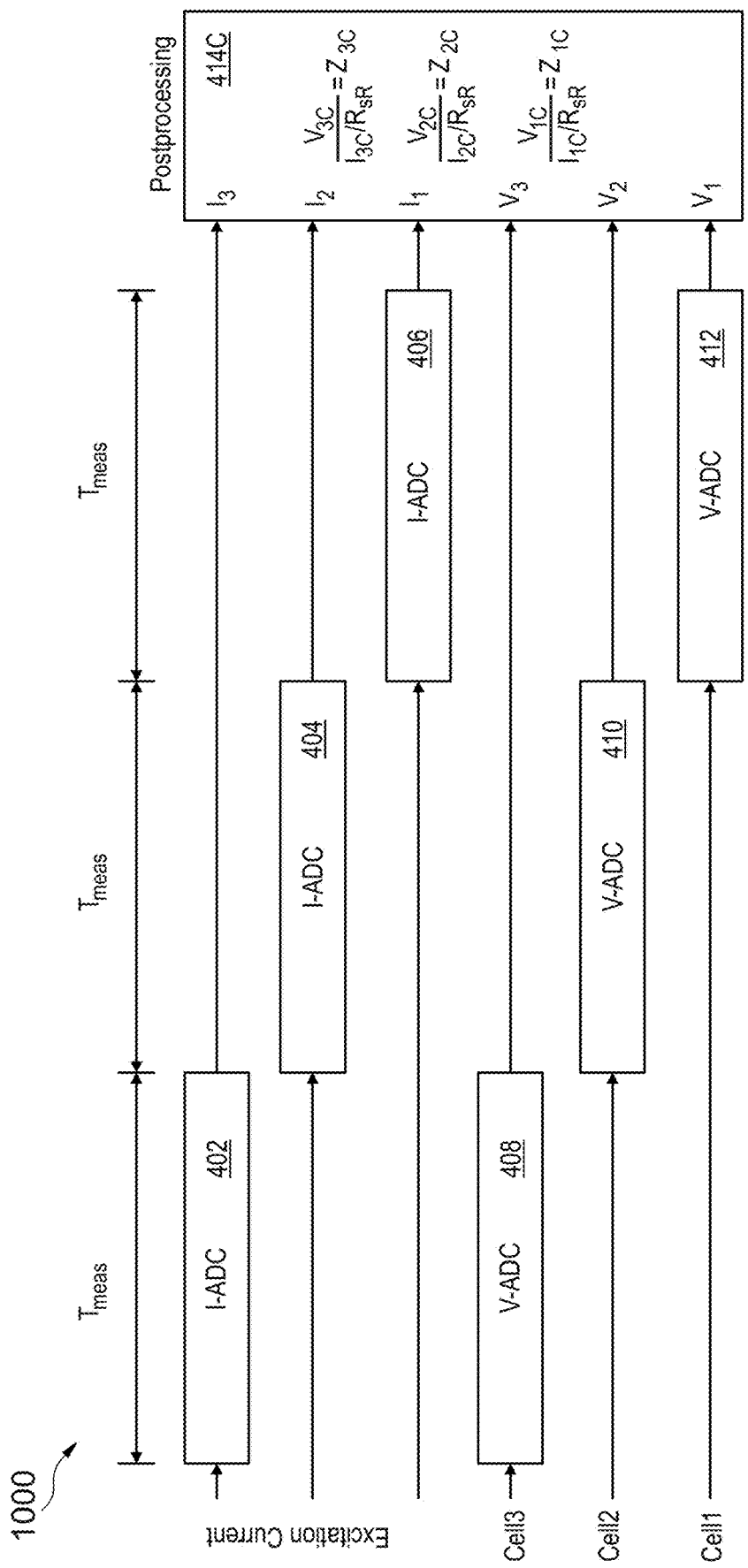
FIG. 8 is a timing diagram of an example measurement sequence for the implementation of FIG. 7.

FIG. 8 shows an example measurement sequence 1000 including three sequential measured excitation currents 402, 404, and 406, as well as three sequential measured battery cell voltages 408, 410, and 412. Postprocessing 414C is provided by digital processing circuit 316D to calculate the AC impedance of each battery cell 304, 306, and 308. Note that three sequential time periods $T_{meas}$ are required for a single measurement cycle.

The resulting AC impedance of each battery cell can be calculated by:

$$Z_{xC} = \frac{V_{xC}}{I_C / R_{sR}}$$

wherein the multiplexer 332 switches between the different battery cells 304, 306, and 308 but the voltage and the current are always measured with the very same ADCs 330 and 334, thus reducing matching issues. The measurement method shown in FIGS. 7 and 8 saves silicon area, since only one pair of ADCs 330 and 334 is required, but only allows a sequential measurement of the different battery cells. Thus, the measurement time increases by a factor, which is equal to the number of cells when compared to a parallel approach. In FIG. 7 and FIG. 8, the factor is equal to three corresponding to the three battery cells 304, 306, and 308 measured by the multi-cell impedance IC 314C.

Figure 9:
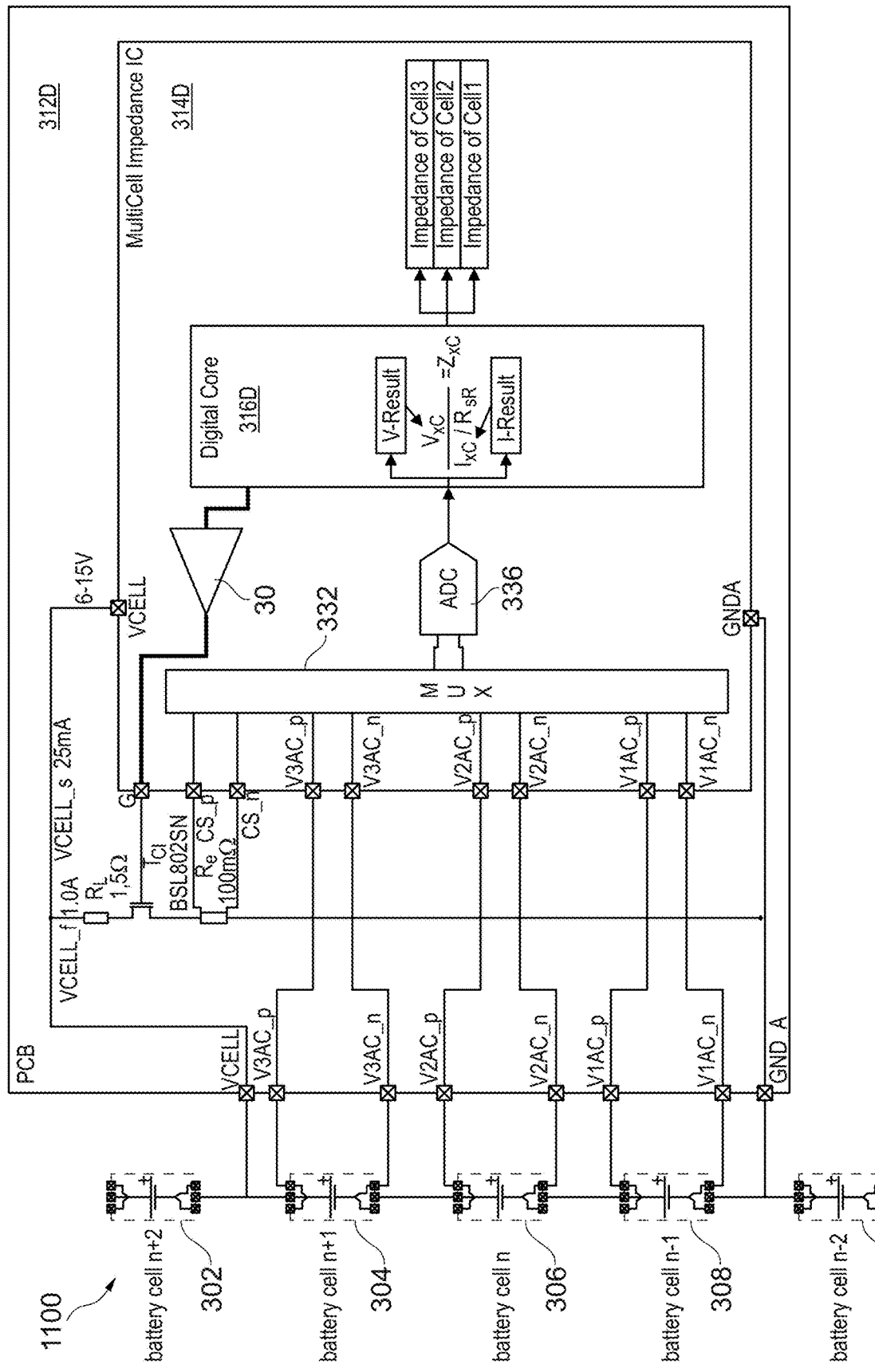
FIG. 9 is a schematic diagram of a single ADC implementation of a multi-cell impedance measurement system.

FIG. 9 is a schematic diagram of a single ADC implementation of a multi-cell impedance measurement system 1100, including a multi-cell impedance IC 314D resident on PCB 312D. The external components and pinout are the same as previously described. Multi-cell impedance IC 314D includes a multiplexer 332 coupled to the plurality of input voltage pad pairs V1AC_p and V1AC_n, V2AC_p and V2AC_n, and V3AC_p and V3AC_n and the current sense pad pair CS_p and CS_n; and a single analog-to-digital converter 336 coupled between the multiplexer 332 and the digital processing circuit 316E. FIG. 9 thus shows the most reduced implementation variant with respect to the required number of ADC components using a multiplexer 332 and a single ADC 336 to sequentially measure the current and the voltage of the three battery cells 304, 306, and 308.

Figure 10:
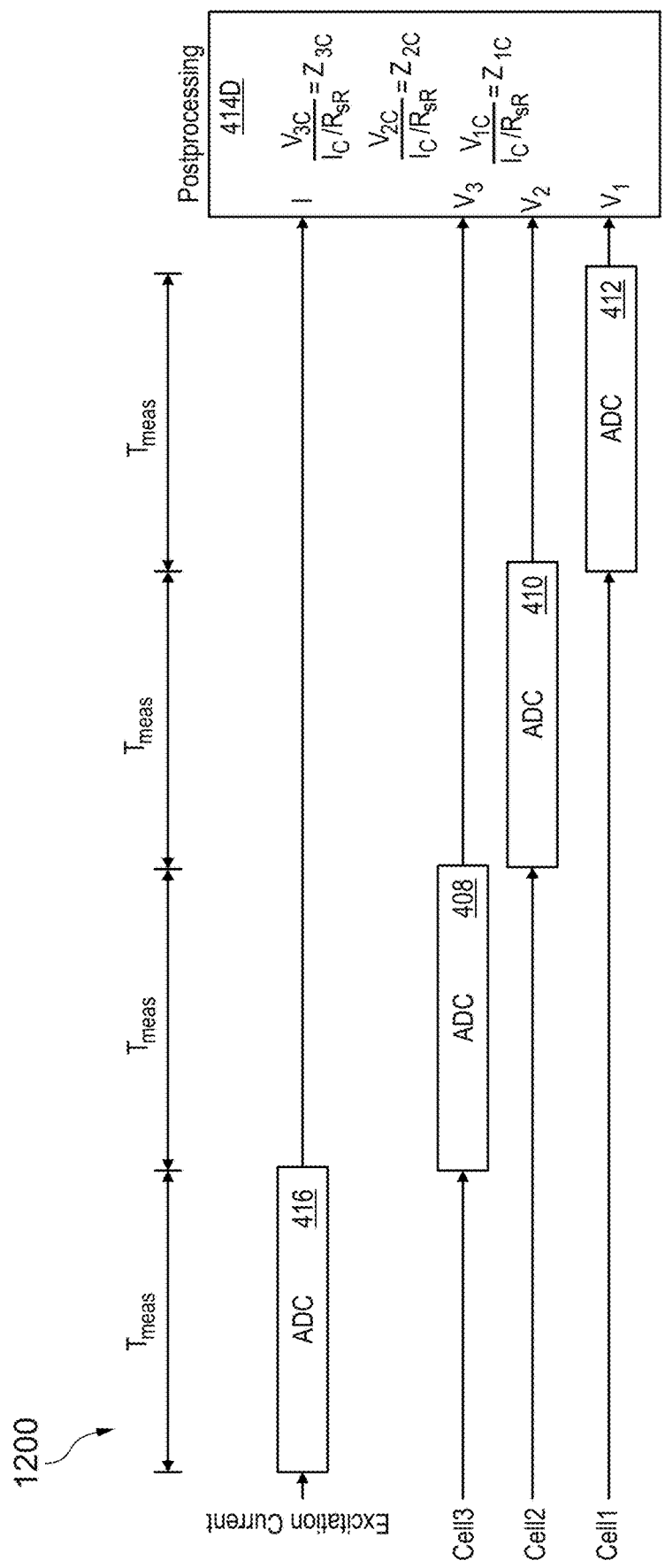
FIG. 10 is a timing diagram of an example measurement sequence for the single ADC implementation of FIG. 9.

FIG. 10 illustrates an example measurement sequence 1200 corresponding to the measurement implementation 1100 shown in FIG. 9. Measurement sequence 1200 includes a single current measurement 416, which is saved, and three sequential voltage measurements 408, 410, and 412. Other permutations of sequential current and voltage measurements are possible. Postprocessing 414D calculates the AC impedance for each battery cell 304, 306, and 308 measured. Note that four measurement periods $T_{meas}$ are required for a single measurement cycle. Alternatively, three sequential current measurements can be made, in which case a total of six measurement period $T_{meas}$ are required for a single measurement cycle.

If the six measurement period method is used, the required measurement time for each impedance measurement is doubled (one voltage measurement and one current measurement for each corresponding battery cell). A way to reduce the total measurement time is to do only one current measurement, save the value and then use it for the calculation of all impedances as shown in FIG. 10. Thus, the overall number of required measurements, i.e. the single measurement cycle time, reduces for the example of three cells from three times two (six) to three plus one (four) measurement time periods. The multi-cell impedance IC 316D regulates the excitation current, and so under stable operation conditions the obtained value of the measured current does not change significantly and thus the measurement approach described above is feasible.

Thus, the total measurement time for the measurement approach shown in FIG. 10 increases by a factor which is equal to the number of battery cells times two (or number of battery cells plus one when using the stored value) when compared to the fully parallel approach described above with respect to, for example, FIG. 3. An advantage of the implementation variant shown in FIG. 9 and FIG. 10 is that the required silicon area can be reduced significantly and that the ADC matching issues are significantly diminished.

Figure 11:
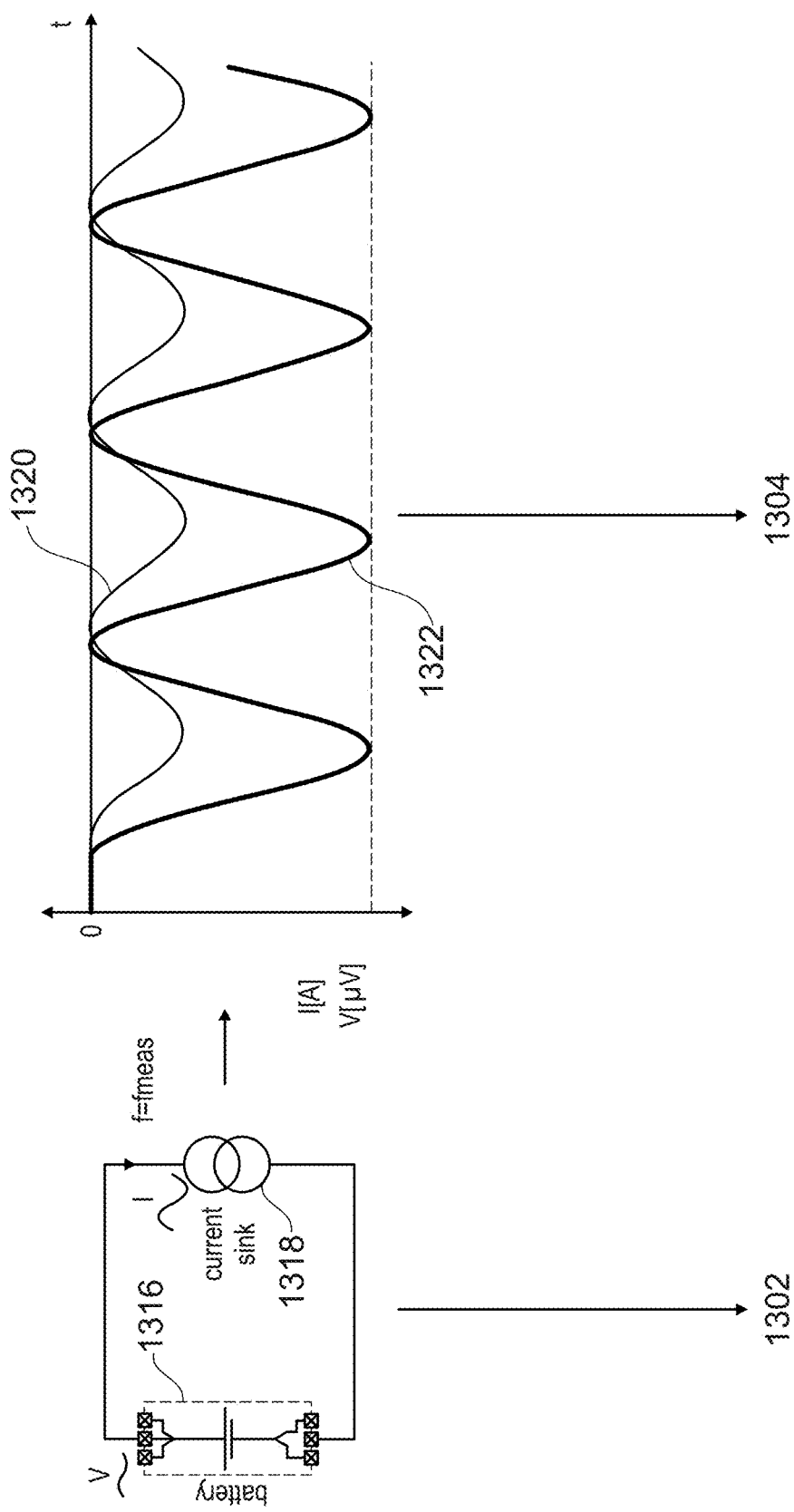
FIG. 11 illustrates components and signals of the first two steps an AC impedance measurement algorithm according to an embodiment.
Figure 12:
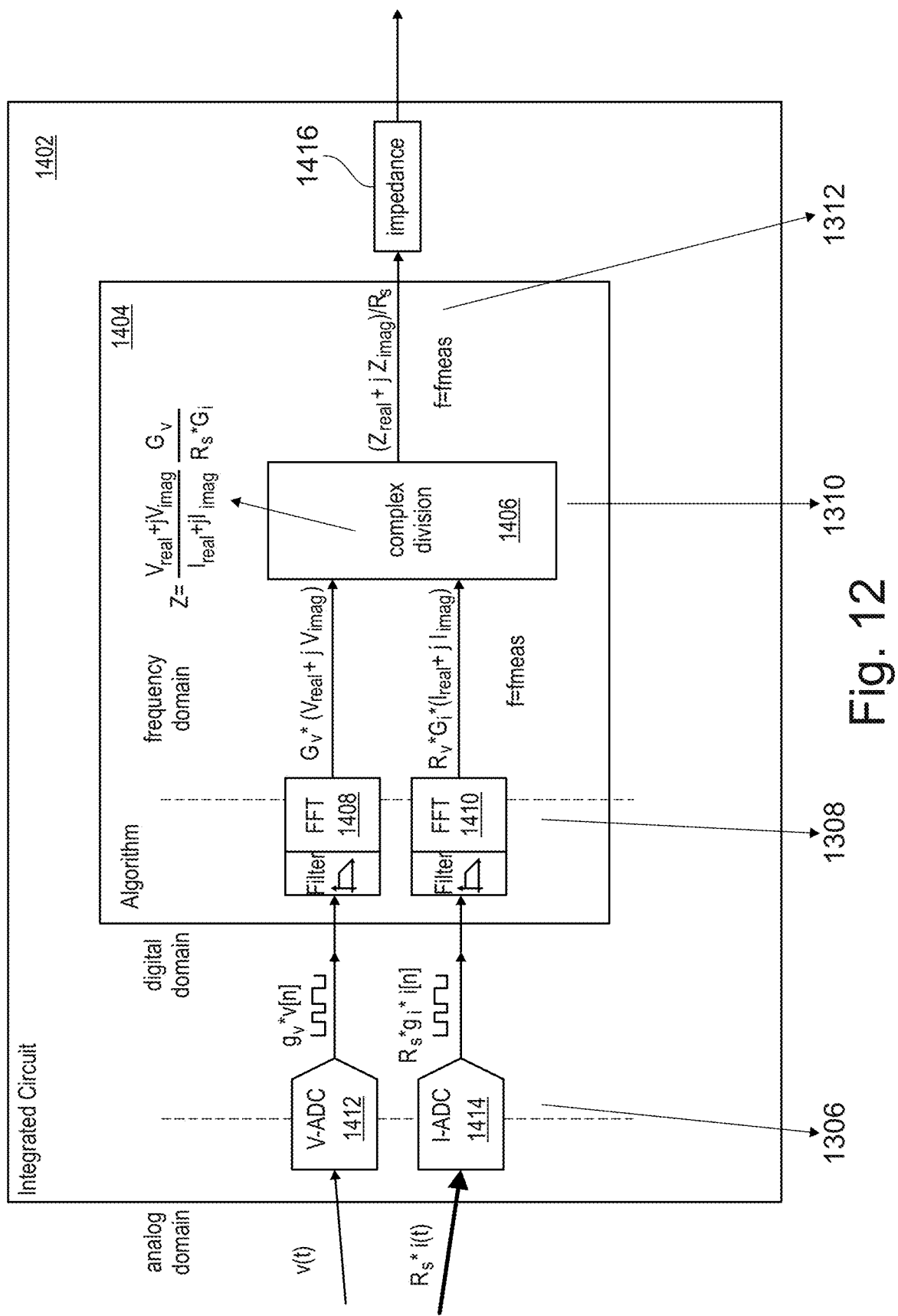
FIG. 12 illustrates components and signal of four subsequent steps of the AC impedance measurement algorithm according to an embodiment.
Figure 13:
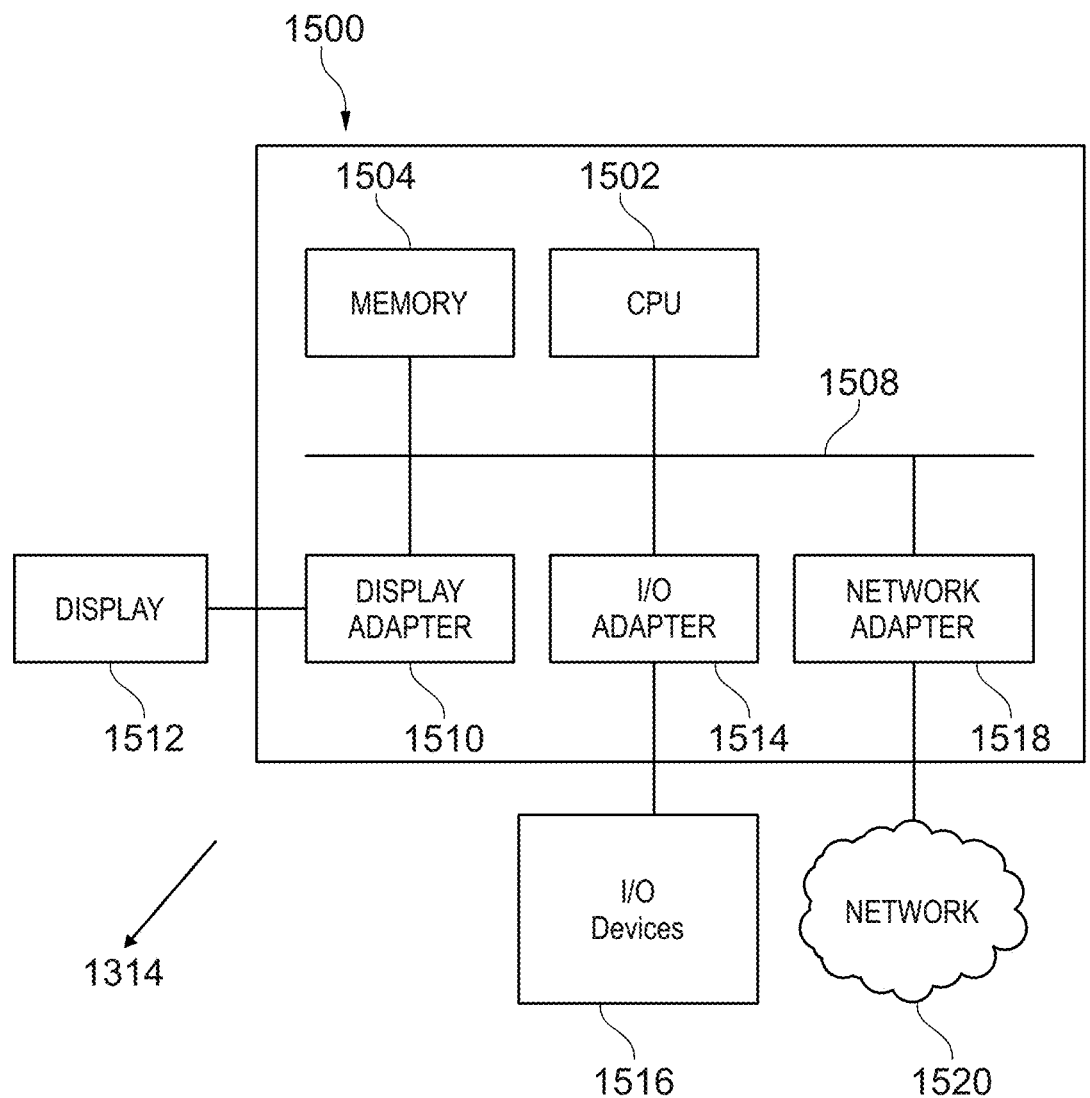
FIG. 13 illustrates a host computer for displaying results of the AC impedance measurement algorithm according to an embodiment.
Figure 14:
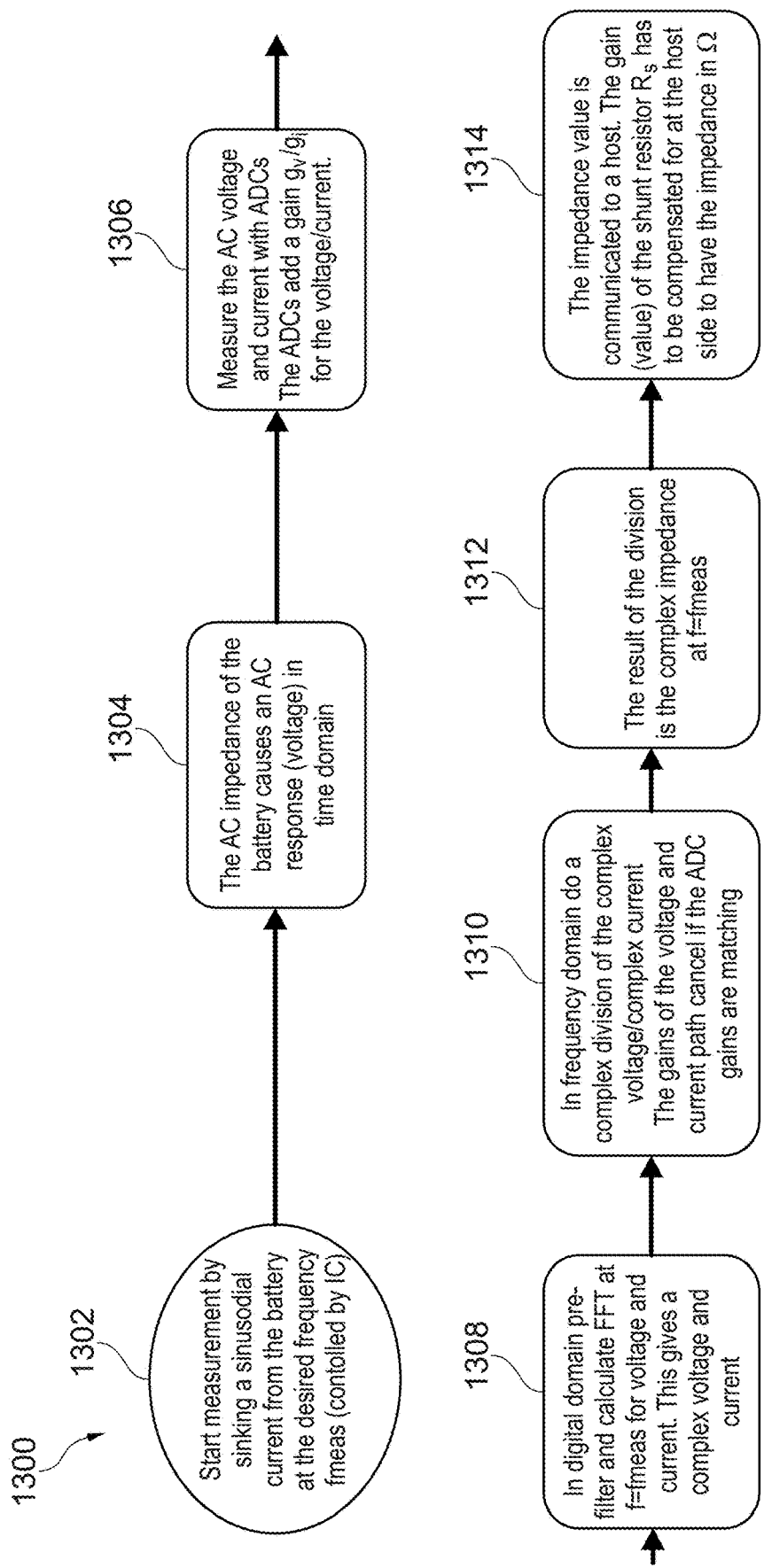
FIG. 14 illustrates a flow chart of the AC impedance measurement algorithm according to an embodiment corresponding to FIG. 11, FIG. 12, and FIG. 13.

FIGS. 11, 12, and 13 collectively illustrate component and signal aspects of an AC impedance measurement algorithm according to an embodiment. The corresponding flow chart 1300 for the AC impedance measurement algorithm is shown in FIG. 14, including steps 1302, 1304, 1306, 1308, 1310, 1312, and 1314. Linking arrows are shown in FIGS. 11, 12, and 13 to aid in correlating these figures with the steps of flow chart 1300 shown in FIG. 14.

In FIG. 11, a representative battery cell 1316 being measured subject to an excitation current 1318 includes a measured voltage 1320 and a measured current 1322. At step 1302 the measurement starts by sinking a sinusoidal current 1318 from the battery cell 1316 at the desired frequency $f_{meas}$, which is controlled by the multi-cell impedance IC previously described. At step 1304, the AC impedance of the representative battery cell 1316 causes an AC response (voltage 1320) in the time domain.

In FIG. 12, a multi-cell impedance IC 1402 is shown including an ADC 1412 for receiving the measured voltage signal and an ADC 1414 for receiving the measured current signal from the battery cell 1316 previously shown in FIG. 11. In an embodiment, ADCs 1412 and 1414 can be multiplexed and combined, or represent one of multiple ADCs as previously described. The inputs of the ADCs 1412 and 1414 are in the analog domain, and the output of ADCs 1412 and 1414 are converted to the digital domain. The converted digital signals at the output of ADCs 1412 and 1414 are respectively received by combined filter and Fast Fourier Transform (FFT) processing blocks 1408 and 1410 inside the digital signal processing circuit 1404. The outputs of the FFT blocks 1408 and 1410 are complex numbers in the frequency domain, which are received by the complex division block 1406, also inside the digital signal processing circuit 1406. The output of the complex division block is the complex impedance of the battery cell 1316 at the frequency of interest, $f=f_{meas}$. In some embodiments, the complex impedance is calculated by dividing the output of FFT block 1408 $G^*(V_{real}+j^*V_{imag})$ by the output of FFT block 1410 $R_S^*G_i^*(I_{real}+j^*I_{imag})$, wherein $G_v$ and $G_i$ are gain factors, and $R_S$ is the series resistor value, previous described. The complex impedance is equal to $Z_{real}+j^*Z_{imag}$ once the gain factors and the series resistor value have been removed, and can be stored in a memory 1416 resident inside the multi-cell impedance IC 1402.

In FIG. 12, at step 1306 the AC voltage and AC current are applied to the input of ADCs 1412 and 1414. The ADCs 1412 and 1414 add a gain $g_v$ to the voltage signal and a gain $g_i$ to the current signal as shown. At step 1308, blocks 1408 and 1410 pre-filter and calculate the FFT at $f=f_{meas}$ for the digital voltage and current signals. At step 1310, block 1406 performs a complex division in the frequency domain of the complex voltage divided by the complex current to calculate the complex impedance of the battery cell 1316. The gains of the voltage and current path cancel if the ADC gains $g_v$ and $g_i$ are made equal. At step 1312 it is noted that the result of the complex division is the complex impedance Z of the battery cell 1316 at $f=f_{meas}$. In alternative embodiments other frequency transformations can be used such as the discrete Fourier transform (DFT), the discrete cosine transform (DCT), and other such frequency transformations.

FIG. 13 shows a host computer 1500 for displaying the complex impedance previously stored in memory 1416. In an embodiment, host computer 1500 is a microcontroller that is in charge of battery management of the entire battery pack. In another embodiment, host computer 1500 can include a digital processing circuit such as Central Processing Unit (CPU) 1502, as well as other optional components such as a memory 1504 including main and cache memory, a display adapter 1510 coupled to an external display 1512, an I/O adapter 1514 coupled to external I/O devices such as a keyboard, and a network adapter 1518 coupled to an external network 1520. The various components of host computer can be linked together by bi-directional bus 1508. Numerous other components can be included in host computer 1500 if desired. In corresponding step 1314, it is noted that the impedance value Z is communicated to host computer 1500. The correct impedance value Z is finally calculated by dividing out the series resistor value $R_S$ and the gain factors as previously described.

FIG. 14 is the corresponding flow chart 1300 for the AC impedance measurement algorithm described above, including steps 1302, 1304, 1306, 1308, 1310, 1312, and 1314 that have all been previously described.

In some embodiments, it is assumed that the measurement system is in a steady state during the time of both voltage and current measurements for greatest accuracy in determining the complex impedance of the battery cells in the battery pack. In some cases, measuring the voltage and the current of the battery cells during, for example, accelerating or breaking of the electric vehicle may make the complex impedance measurement less accurate or less representative of the true operating condition of the battery cell.

Although three battery cells have been shown as being measured during a single measurement cycle by a single multi-cell impedance IC, any number of battery cells may be used. Measurements are not limited to three battery cells per multi-cell impedance IC. A range of two to six, or two to eighteen battery cells can be used, in embodiments.

Regardless of the exact measurement system and method used as described herein, the measurement system in general is not limited to a common excitation current for use with a subset of battery cells in a battery pack, but the measurement system can also be configured to use an individual excitation current per cell. The individual excitation current can be provided by transistors on a PCB along with the multi-cell impedance IC.

While some embodiments have been shown as including a separate multi-cell integrated circuit and a corresponding printed circuit board, all of the components can be integrated inside of the multi-cell integrated circuit. For example, the excitation current provided by a transistor and series resistors can also be integrated inside of the multi-cell integrated circuit if desired. This integrated solution is especially attractive for lower excitation current requirements or battery cells with inherently higher impedances. Conversely, embodiments of the complex impedance measurement system can all be fabricated out of individual components on a printed circuit board, without a dedicated multi-cell integrated IC.

A way to advantageously reduce the measurement time for all the sequential implementation variants is to perform only one current measurement, save the value, and then subsequently use this value for the calculation of the impedance. The value for the current needs to be updated only when the operating conditions significantly change, for example, when a change of excitation amplitude or frequency is desired.

It will be appreciated by those skilled in the art that a mix of the different implementation variants described herein is possible to achieve a good tradeoff between silicon area and total measurement time.

To further reduce the system costs, the number of sense wires can be reduced at the cost of a somewhat lower measurement accuracy. For example, in, for example FIG. 3 (and in subsequent Figures) the sense wires V2AC_p and V1AC_p could be removed. In other words, instead of voltage pad pairs, only one sense line per battery cell, plus one extra sense line, need be used in an embodiment.

Table 1 shows a summary of the proposed measurement system implementation variants, wherein $N_{cell}$ is the number of battery cells being measured per multi-cell impedance IC, and $T_{meas}$ is the time of an individual measurement time period.

TABLE 1

Comparison of the key parameters of different AC impedance measurement system implementations.

| Variant | Number of ADCs | | Required Measurement Time | Matching |
|---|---|---|---|---|
| Completely Parallel | parallel | $N_{cell} \times 2$ | $T_{meas}$ | medium |
| Ncell ADC | sequential/ parallel | $N_{cell}$ | $T_{meas} \times 2$ | simple |
| Single ADC pair | parallel/ sequential | 2 | $T_{meas} \times N_{cell}$ | medium/ simple |
| Single ADC | sequential | 1 | $T_{meas} \times N_{cell} \times 2$ $T_{meas} \times N_{cell} + 1$ | simple |

Note that in Table 1 there is a tradeoff between the number of ADCs used and the total measurement time used in a single measurement cycle. For example, the completely parallel configuration uses six ADCs but all three complex impedances are calculated concurrently in a single time period. The single ADC configuration uses a single ADC, but as many as six time periods may be required to calculate all three complex impedances. Any of the above approaches can be used to accommodate a specific application.

Example embodiments of the present invention are summarized here. Other embodiments can also be understood from the entirety of the specification and the claims filed herein.

Example 1. According to an embodiment, a method for measuring a complex impedance of a plurality of battery cells in a battery pack includes controlling an excitation current through the plurality of battery cells in the battery pack; receiving, in a single common measurement circuit, a plurality of voltage signals corresponding to the plurality of battery cells; measuring the excitation current; and calculating a complex impedance of each of the battery cells in the plurality of battery cells based on the plurality of voltage signals and the measured excitation current in a single measurement cycle using either one analog-to-digital converter (ADC) per battery cell or two matched ADCs per battery cell.

Example 2. The method of Example 1, wherein controlling the excitation current includes controlling an excitation current generator coupled across the plurality of battery cells.

Example 3. The method of any of the previous examples, wherein receiving the plurality of voltage signals comprises receiving the plurality of voltage signals from the plurality of battery cells via a plurality of Kelvin terminal pairs, wherein each battery cell of the plurality of battery cells is associated with a Kelvin terminal pair of the plurality of Kelvin terminal pairs, each Kelvin terminal pair comprising a first Kelvin terminal connected to a first end of the battery cell and a second Kelvin terminal connected to a second end of the battery cell, and wherein each Kelvin terminal pair of each battery cell is separate from each other and not shared with any other battery cell.

Example 4. The method of any of the previous examples, wherein the single common measurement circuit includes a single integrated circuit chip.

Example 5. The method of any of the previous examples, wherein the plurality of battery cells includes between two and eighteen battery cells.

Example 6. The method of any of the previous examples, further including receiving a first voltage signal associated with a first battery cell of the plurality of battery cells; receiving a second voltage signal associated with the first battery cell and a second battery cell of the plurality of battery cells; and calculating a complex impedance of a connector between the first and second battery cells based on the first voltage signal, the second voltage signal, and the measured excitation current.

Example 7. The method of any of the previous examples, further including sequentially receiving the plurality of voltage signals.

Example 8. The method of any of the previous examples, wherein the single measurement cycle includes a single measurement time period.

Example 9. According to an embodiment, a circuit includes a voltage measurement circuit coupled to a plurality of input voltage pad pairs, the input voltage pad pairs configured for coupling to a corresponding plurality of battery cells coupled in series in a battery pack; a high side pad configured for coupling to a first end of the plurality of battery cells coupled in series in the battery pack; a low side pad configured for coupling to a second end of the plurality of battery cells coupled in series in the battery pack; an excitation current generator coupled between the high side pad and the low side pad for controlling an alternating current flowing through the plurality of battery cells; a current measurement circuit coupled to a current sense element configured for generating a voltage representative of a current through at least one of the plurality of battery cells in the battery pack; at least one matched pair of analog-to-digital converters (ADCs); and a digital processing circuit coupled to the plurality of input voltage pad pairs and the current sense element configured for activating the excitation current generator, receiving a voltage measurement signal from the voltage measurement circuit, measuring the received voltage measurement signal with a first ADC of the at least one matched pair of ADCs, receiving a current measurement signal from the current measurement circuit, measuring the received current measurement signal with a second ADC of the at least one match pair of ADCs, and calculating a complex impedance of each of the plurality of battery cells in the battery pack in a single measurement cycle from the received voltage measurement signal and the received current measurement signal.

Example 10. The circuit of any of Example 9, wherein the plurality of input voltage pad pairs are configured to be coupled to a corresponding plurality of Kelvin terminal pairs, wherein each battery cell of the plurality of battery cells is associated with a Kelvin terminal pair of the plurality of Kelvin terminal pairs, each Kelvin terminal pair comprising a first Kelvin terminal connected to a first end of the battery cell and a second Kelvin terminal connected to a second end of the battery cell, and wherein each Kelvin terminal pair of each battery cell is separate from each other and not shared with any other battery cell.

Example 11. The circuit of any of the previous examples, wherein the voltage measurement circuit, the current measurement circuit, and the digital processing circuit are all formed in a single integrated circuit chip.

Example 12. The circuit of any of the previous examples, wherein the plurality of battery cells includes between two and eighteen battery cells.

Example 13. The circuit of any of the previous examples, wherein the digital processing circuit is configured for calculating a plurality of complex impedances of each of the plurality of battery cells in the battery pack at a plurality of measurement frequencies to characterize at least one parameter of each of the plurality of battery cells in the battery pack.

Example 14. The circuit of any of the previous examples, further including a driver circuit coupled between the digital processing circuit and the excitation current generator.

Example 15. The circuit of any of the previous examples, wherein the driver circuit includes a buffer amplifier.

Example 16. The circuit of any of the previous examples, wherein the driver circuit includes a digital-to-analog converter.

Example 17. The circuit of any of the previous examples, wherein the excitation current generator includes a transistor coupled between the high side pad and the low side pad for forcing a single current through the plurality of battery cells in the battery pack.

Example 18. The circuit of any of the previous examples, further including a multiplexer configured for coupling the digital processing circuit to a first input voltage pad pair to calculate a first complex impedance of a first battery cell of the plurality of battery cells and configured for coupling the digital processing circuit to a pad of the first input voltage pad pair and a pad of a second input voltage pad pair to calculate the first complex impedance of the first battery cell plus a series complex impedance of a cell connector associated with the first battery cell.

Example 19. The circuit of any of the previous examples, wherein the at least one matched pair of ADCs comprises a plurality of matched pairs of ADCs, the first ADC of each matched pair of ADCs is coupled between the plurality of input voltage pad pairs and the digital processing circuit, and the second ADC of each matched pair of ADCs is coupled between the current sense element and the digital processing circuit.

Example 20. The circuit of any of the previous examples, further comprising a multiplexer coupled to the plurality of input voltage pad pairs and the first ADC of each matched pair of ADCs.

Example 21. The circuit of any of the previous examples, wherein the at least one matched pair of ADCs comprises a single matched pair of ADCs; and wherein the circuit further comprises a multiplexer coupled to the plurality of input voltage pad pairs, and the first ADC of each matched pair of ADCs.

Example 22. According to an embodiment, a battery measurement system includes an excitation current source configured to be coupled across a plurality of battery cells; a current sense element coupled to the excitation current source; a plurality of separate data converter circuits, wherein each separate data converter circuit of the plurality of separate data converter circuits includes a current sense input coupled to the current sense element and a pair of voltage sense inputs configured to be coupled across a corresponding battery cell of the plurality of battery cells, and each separate data converter circuit is configured to provide current measurement data based on a signal at the current sense input and voltage measurement data based on a signal at the pair of voltage sense inputs; and a digital processing circuit coupled to the plurality of separate data converter circuits, the digital processing circuit configured to calculate a complex impedance for each battery cell of the plurality of battery cells based on the current measurement data and the voltage measurement data provided by the separate data converter associated with the corresponding battery cell.

Example 23. The battery measurement system of Example 22, wherein the excitation current source, the current sense circuit and the plurality of separate data converter circuits are disposed on a same circuit board; and each voltage sense input of each pair of voltage sense input is coupled to a corresponding battery connection pad of a plurality of battery connection pads disposed on the circuit board.

Example 24. The battery measurement system of any of the previous examples, further including a multiplexer coupled between the plurality of battery connection pads and the pairs of voltage sense input of the plurality of separate data converter circuits.

Example 25. The battery measurement system of any of the previous examples, wherein the plurality of separate data converter circuits and the digital processing circuit are disposed on a single semiconductor substrate.

Example 26. The battery measurement system of any of the previous examples, wherein each separate data converter circuit includes a first analog-to-digital converter having inputs coupled to the pair of voltage sense inputs and a second analog-to-digital converter coupled to the current sense element, and the first analog-to-digital converter is matched to the second analog-to-digital converter.

Example 27. The battery measurement system of any of the previous examples, wherein each separate data converter circuit includes a single analog-to-digital converter; and a multiplexer having a first input coupled to the current sense element, a second input coupled to the pair of voltage sense inputs, and an output coupled to an input of the single analog-to-digital converter.

Example 28. The battery measurement system of any of the previous examples wherein the excitation current source includes a transistor having a load path coupled in series with the transistor; and the current sense element includes a resistor coupled in series with the load path of the transistor.

It is an advantage that embodiments of the complex impedance measurement system provide an efficient solution to measure the AC impedance of multiple, stacked, battery cells as well as corresponding cell connectors of a battery pack in a single measurement cycle using a single multi-cell AC impedance IC, thus reducing overall system costs since a separate measurement IC and supporting components are not required for every battery cell in the battery pack.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for measuring a complex impedance of a plurality of battery cells in a battery pack, the method comprising:
   controlling an excitation current through the plurality of battery cells in the battery pack;
   receiving, in a single common measurement circuit, a plurality of voltage signals corresponding to the plurality of battery cells;
   measuring the excitation current;
   calculating a complex impedance of each of the battery cells in the plurality of battery cells based on the plurality of voltage signals and the measured excitation current in a single measurement cycle using either one analog-to-digital converter (ADC) per battery cell or two matched ADCs per battery cell;
   receiving a first voltage signal associated with a first battery cell of the plurality of battery cells;
   receiving a second voltage signal associated with the first battery cell and a second battery cell of the plurality of battery cells; and
   calculating a complex impedance of a connector between the first and second battery cells based on the first voltage signal, the second voltage signal, and the measured excitation current, wherein the complex impedance comprises a resistive portion and an inductive portion.

2. The method of claim 1, wherein controlling the excitation current comprises controlling an excitation current generator coupled across the plurality of battery cells.

3. The method of claim 1, wherein receiving the plurality of voltage signals comprises receiving the plurality of voltage signals from the plurality of battery cells via a plurality of Kelvin terminal pairs, wherein each battery cell of the plurality of battery cells is associated with a Kelvin terminal pair of the plurality of Kelvin terminal pairs, each Kelvin terminal pair comprising a first Kelvin terminal connected to a first end of the battery cell and a second Kelvin terminal connected to a second end of the battery cell, and wherein each Kelvin terminal pair of each battery cell is separate from each other and not shared with any other battery cell.

4. The method of claim 1, wherein the single common measurement circuit comprises a single integrated circuit chip.

5. The method of claim 1, wherein the plurality of battery cells comprises between two and eighteen battery cells.

6. The method of claim 1, further comprising sequentially receiving the plurality of voltage signals.

7. The method of claim 1, wherein the single measurement cycle comprises a single measurement time period.

\* \* \* \* \*